(12) United States Patent
Hase et al.

(10) Patent No.: US 7,462,892 B2
(45) Date of Patent: Dec. 9, 2008

(54) SEMICONDUCTOR DEVICE

(75) Inventors: Ichiro Hase, Kanagawa (JP); Ken Sawada, Kanagawa (JP); Masaya Uemura, Tokyo (JP)

(73) Assignee: Sony Corporation, Tokyo (JP)

( * ) Notice: Subject to any disclaimer, the term of this patent is extended or adjusted under 35 U.S.C. 154(b) by 35 days.

(21) Appl. No.: 11/459,508

(22) Filed: Jul. 24, 2006

(65) Prior Publication Data

US 2007/0023783 A1 Feb. 1, 2007

(30) Foreign Application Priority Data

Jul. 26, 2005 (JP) ............................. 2005-215477

(51) Int. Cl.
*H01L 27/082* (2006.01)
(52) U.S. Cl. ............... 257/198; 257/197; 257/E29.188; 257/E29.189; 257/185; 257/335
(58) Field of Classification Search .......... 257/E29.188, 257/E29.189, 197, 198
See application file for complete search history.

(56) References Cited

U.S. PATENT DOCUMENTS 6,822,274 B2 * 11/2004 Yi et al. ................... 257/189

2002/0070390 A1 * 6/2002 Chow ........................ 257/197
2003/0136956 A1 * 7/2003 Niwa et al. .................. 257/12

FOREIGN PATENT DOCUMENTS

| JP | 05-136159 | 6/1993 |
|----|-----------|--------|
| JP | 07-211729 | 8/1995 |

OTHER PUBLICATIONS

Y. S. Lin; Breakdown characteristics of InP/InGaAs composite-collector double heterojunction bipolar transistor; Applied Physics Letters; vol. 83, No. 26, Dec. 29, 2003.

* cited by examiner

*Primary Examiner*—Evan Pert
*Assistant Examiner*—Scott R Wilson
(74) *Attorney, Agent, or Firm*—Sonnenschien Nath & Rosenthal LLP

(57) ABSTRACT

A semiconductor device includes an emitter layer: a base layer; and a collector layer, wherein the collector layer and the emitter layer each include a heavily doped thin sublayer having a high impurity concentration, and each of the heavily doped thin sublayers has an impurity concentration higher than those of semiconductor layers adjacent to each heavily doped thin sublayer.

8 Claims, 18 Drawing Sheets

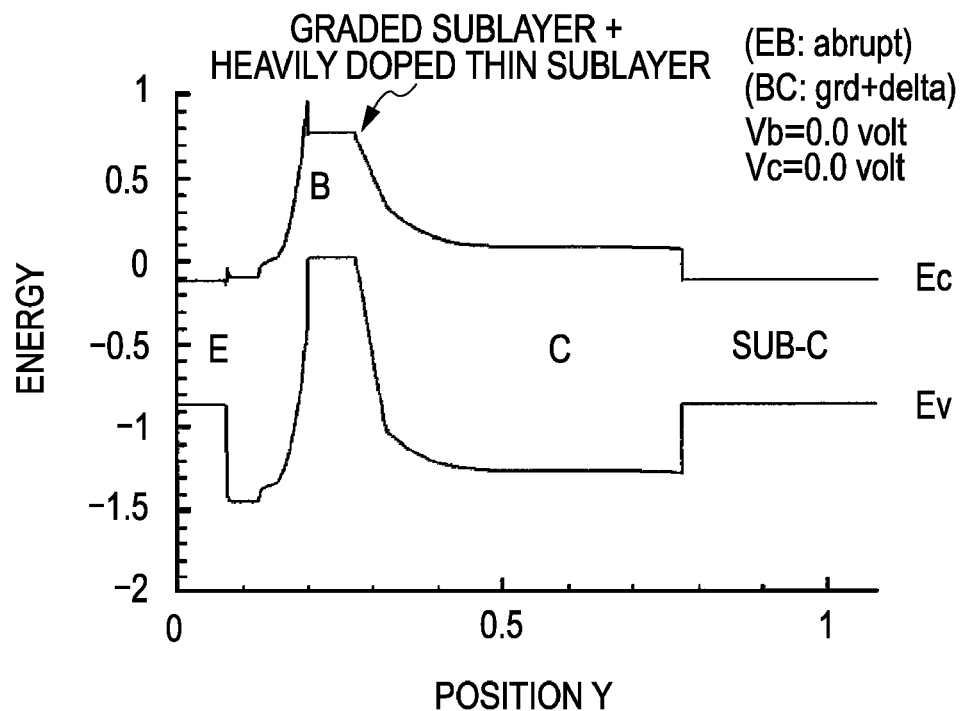
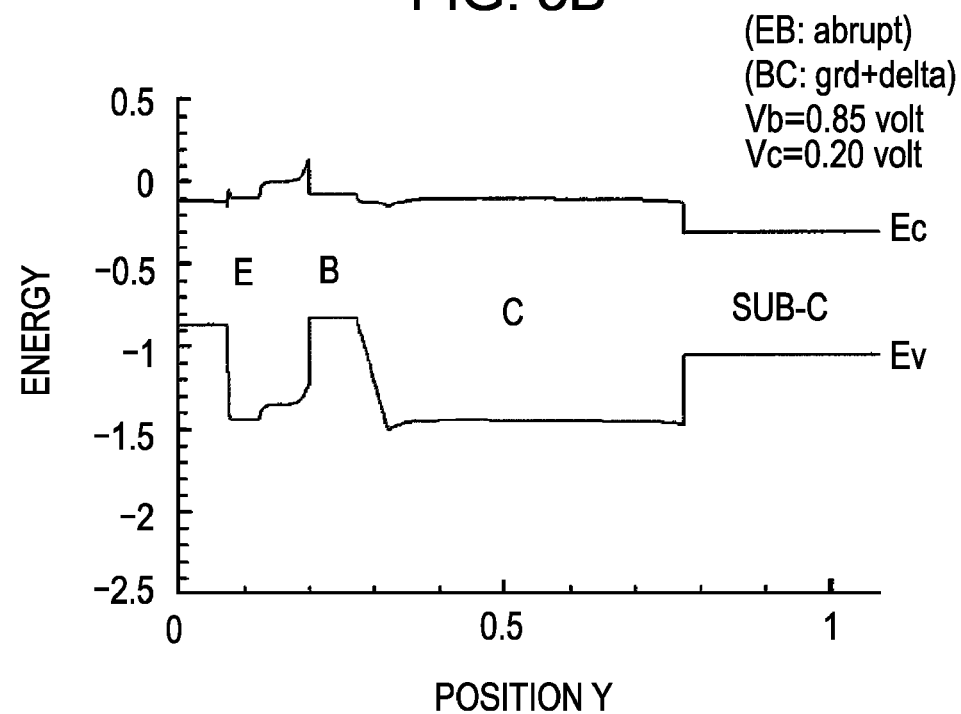

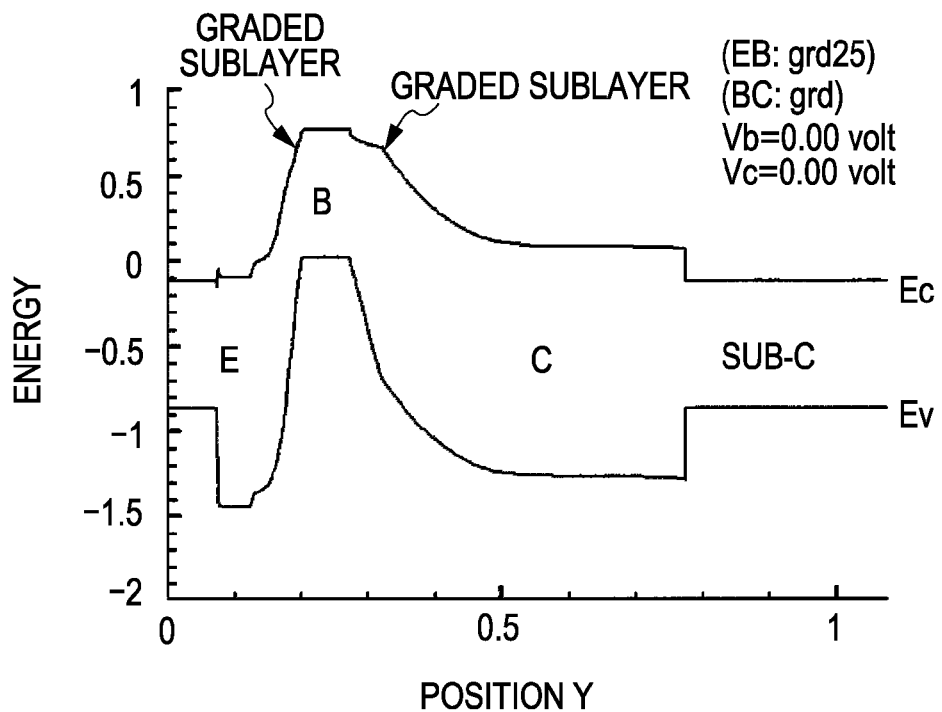
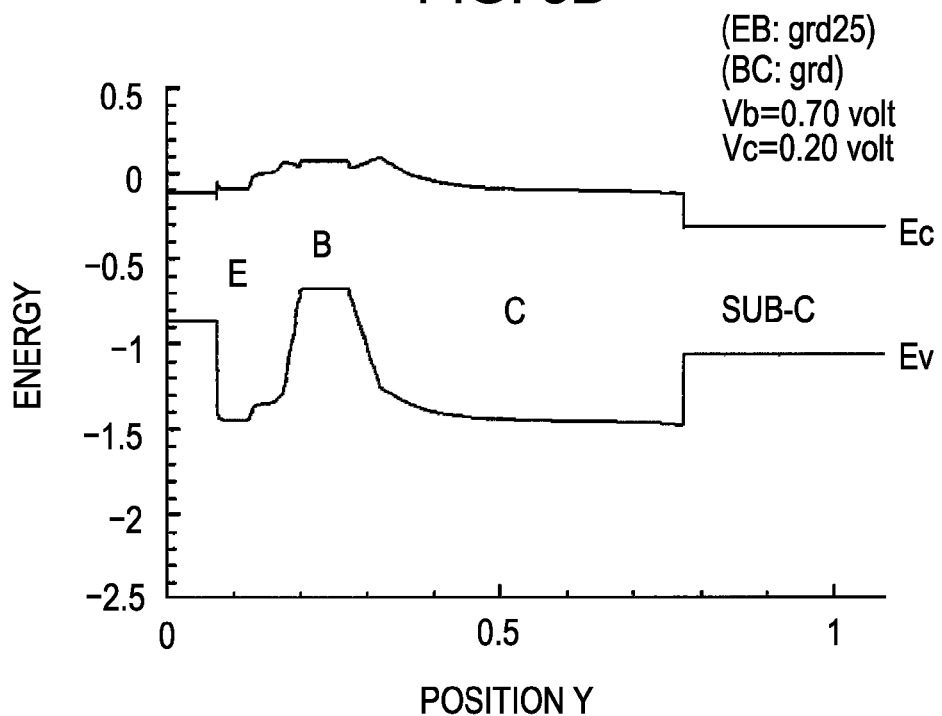

RELATED EXAMPLE

SEMICONDUCTOR DEVICE

CROSS REFERENCES TO RELATED APPLICATIONS

The present invention contains subject matter related to Japanese Patent Application JP 2005-215477 filed in the Japanese Patent Office on Jul. 26, 2005, the entire contents of which are incorporated herein by reference.

BACKGROUND OF THE INVENTION

1. Field of the Invention

The present invention relates to semiconductor devices. In particular, the present invention relates to a semiconductor device including a heterojunction bipolar transistor.

2. Description of the Related Art

A heterojunction bipolar transistor (hereinafter, referred to as a "HBT") is a type of a bipolar transistor. The HBT includes an emitter layer composed of a material having a band gap greater than that of a base layer. Even when the base layer has an impurity concentration higher than that in the emitter layer, electron injection efficiency (emitter efficiency) from the emitter layer to the base layer can be maintained at a high level. Thus, the HBT has basic advantages in that emitter-base capacitance and base resistance can be reduced and punch-through in the base layer can be suppressed, without a decrease in current gain due to reduced emitter efficiency.

Referring to FIG. 19, a known HBT 74a as an example will be described (see Patent Document 1: Japanese Unexamined Patent Application Publication No. 7-211729, page 5, left column, line 17 to page 5, right column, line 6; and FIG. 1).

In the heterojunction bipolar transistor 74a, an $n^+$-type GaAs subcollector layer (not shown), an n-type GaAs collector layer 53, a p-type GaAs base layer 54, an n-type AlGaAs emitter layer 55, an $n^+$-type GaAs emitter contact layer 55b, a base electrode 65, and an emitter electrode 66 that are laminated on a semi-insulating GaAs substrate (not shown). Side faces of the emitter layer 55, the emitter contact layer 55b, and the emitter electrode 66 are covered with an insulating film 70.

The base layer on the collector layer 53 includes an intrinsic base region 54b having a carbon concentration of $1 \times 10^{20}$ $cm^{-3}$. Carbon is passivated with hydrogen; hence, hole concentration is $5 \times 10^{19}$ $cm^{-3}$.

An external base region (base contact region) 54c having a carbon concentration of $1 \times 10^{20}$ $cm^{-3}$ is disposed on the periphery of the surface of the base layer. Substantially 100% of carbon is activated; hence, hole concentration is $1 \times 10^{20}$ $cm^{-3}$. The emitter layer 55 is disposed on the intrinsic base region 54b so as to form a heterojunction. The base electrode 65 is in ohmic contact with the external base region 54c.

FIG. 20 shows a heterojunction bipolar transistor 74b as another example (see Patent Document 2: Japanese Unexamined Patent Application Publication No. 5-136159, page 4, right column, line 17 to page 6, left column, lime 9; and FIG. 1).

The heterojunction bipolar transistor 74b includes a laminate containing a subcollector layer 52, a GaAs collector layer 53, a p-type AlGaAs base layer 54, an n-type AlGaAs emitter layer 55, an n-type InGaAs emitter cap layer 76, an emitter contact layer 55b, a collector electrode 67, a base electrode 65, and emitter electrode 66 disposed on a semi-insulating GaAs substrate 51.

The emitter electrode 66 composed of a nonalloy electrode material is formed in an initial step in a process for producing the HBT 74b. An emitter mesa and the base electrode 65 are formed in a self-aligned manner with respect to the emitter electrode 66. Furthermore, the base and a collector mesa are formed in a self-aligned manner with respect to the base electrode 65.

The HBT 74b has an emitter ledge structure. The base electrode 65 is formed on the extension of the lower portion of the emitter layer 55. A Pt-diffused region 73 (base contact) is formed in the lower portion to cover the surface of the base layer 54, thereby effectively preventing recombination at the surface.

Such HBTs can operate at high current and are thus satisfactory as devices for power amplifiers (hereinafter, also referred to as "PAs"). Furthermore, in recent years, the HBTs have been used for PAs for mobile communication terminals because single supply operation is advantageously easy.

Power-added efficiency (PAE) is one of the important indicators in the PA. The PAE is defined as the ratio of the difference between an output power Pout and an input power Pin to a dc input power Pdc, i.e., (Pout - Pin)/Pdc. The PAE is an indicator representing the efficiency of the PA. A large PAE results in the suppression of power consumption. In the mobile communication terminals, the power consumption of the power amplifier accounts for the major share of the total power consumption. Thus, it is particularly important to increase the PAE.

To increase the PAE, it may be necessary to minimize a knee voltage (Vk) in the relationship between the collector current (Ic) and the collector-to-emitter voltage (Vce) of the HBT. FIG. 21 is a schematic graph showing the Ic-Vce characteristics and the knee voltage (Vk). As is clear from this figure, in order to reduce the knee voltage (Vk), in the Ic-Vce characteristics, it may be necessary to minimize a voltage when Ic=0, i.e., an offset voltage (Voff), and to minimize on-resistance (Ron) when Ic starts to flow.

To reduce the Voff, it may be necessary to minimize the difference expressed as (Vbe-on)−(Vbc-on), wherein Vbe-on represents the forward turn-on voltage of an emitter-base pn junction, and Vbc-on represents the forward turn-on voltage of a base-collector pn junction. In a HBT including a type-I heterojunction, such as AlGaAs/GaAs, as an emitter-base junction, energy discontinuity occurs between conduction band edges to increase Vbe-on. For the purpose of decreasing Vbe-on, a graded sublayer for smoothly connecting band gaps is often disposed between the emitter layer and the base layer.

For example, in a HBT including a base layer and a collector layer that are composed of a semiconductor having the same composition, applying a positive voltage to the base layer results in the injection of holes from the base layer to the collector layer to increase a forward current that flows from the collector layer to the base layer, thus increasing Voff. A double heterojunction structure including a wide-band-gap semiconductor disposed at a collector side is effective in suppressing the hole injection (see Non-Patent Document 1: Applied Physics Letters, 29 Dec. 2003, Vol. 83, No. 26, pages 5545-5547).

However, also in a base-collector junction, energy discontinuity generally occurs between conduction band edges. In particular, when the collector layer has an electron affinity lower than that of the base layer, the energy discontinuity between the conduction band edges inhibits the flow of current, thereby causing the degradation of Ron. To prevent as much as possible such problems, it is known that an undoped layer that have the same composition as that of the base layer or a graded sublayer is disposed between the base layer and the collector layer.

On the other hand, in a practical HBT described in Patent Document 2, from the standpoint of reliability, in order to suppress surface recombination between an emitter layer and a base layer, the emitter layer is not completely removed but partly left in a region for forming a base electrode, in other words, an emitter ledge structure is generally formed. In this structure, the emitter-base junction is not exposed; hence, the structure is useful for the suppression of degradation in reliability due to the increase of surface defects.

SUMMARY OF THE INVENTION

As described above, in such a double-heterojunction bipolar transistor (DHBT), the incorporation of graded sublayers between the emitter layer and the base layer and between the base layer and the collector layer generally reduces the offset voltage (Voff) and the knee voltage (Vk). However, to minimize these parameters and to facilitate the production of the ledge structure, it may be necessary to optimize the structure. This will be described in detail below.

The presence of conduction band discontinuity between the base layer and the collector layer due to the collector layer having an electron affinity lower than that of the base layer inhibits the flow of a current. To prevent this inhibition, for example, the case where a uniform graded sublayer is disposed between the base layer and the collector layer to smoothly connect potential levels at the conduction band edges of the base layer and the collector layer will be discussed below.

When the pn junction between the base layer and the collector layer is reverse-biased, there is no particular problem. When the pn junction is forward-biased, the knee voltage (Vk) increases because of the influence of the discontinuity between the conduction band edges. This problem might not be important when there is the energy discontinuity between the conduction band edges of the emitter layer and the base layer and thermoelectrons are injected from the emitter layer to the base layer. Because there is a possibility that electrons injected from the emitter layer to the base layer do not sufficiently lose energy and exceed a potential barrier generated between the base layer and the collector layer if the potential barrier is small.

However, when the uniform graded sublayer is disposed between the emitter layer and the base layer, the average energy of electrons injected into the base layer is smaller than that in the above-described example. As a result, the influence of the potential barrier generated between the base layer and the collector layer is increased. That is, just disposing the graded sublayers between the emitter layer and the base layer and between the base layer and the collector layer results in an insufficient reduction in Vk.

Furthermore, use of the above-described emitter ledge structure including the graded sublayer disposed between the emitter layer and the base layer leads to the following problems. That is, although the graded sublayer having a smaller thickness is preferred in view of the formation of a base contact, the turn-on voltage (Vbe-on) of the emitter-base junction increases with decreasing thickness, thereby increasing Voff and Vk. In contrast, an increase in the thickness of the graded sublayer makes it more difficult to form the base contact by alloying.

In the above-described double-heterojunction bipolar transistor, in general, there is also a problem in that the speed performance of the collector layer is readily degraded.

The present invention was accomplished in view of the above-described situation. With respect to a high-reliability heterojunction bipolar transistor or a semiconductor device including the heterojunction bipolar transistor, it is desirable to provide a device structure in which a satisfactory reduced knee voltage (Vk) is achieved, a base contact is easily formed, and the speed performance of a collector is not easily degraded. Furthermore, it is desirable to provide a microwave monolithic integrated circuit (MMIC) mainly having this device structure.

According to an embodiment of the present invention, there is provided a heterojunction bipolar transistor or the like at least including an emitter layer, a base layer, and a collector layer (further including a subcollector layer); or a semiconductor device mainly including the heterojunction bipolar transistor, wherein the collector layer and the emitter layer each include a heavily doped thin sublayer having a high impurity concentration, and each of the heavily doped thin sublayers has an impurity concentration higher than those of semiconductor layers adjacent to each heavily doped thin sublayer.

According to an embodiment of the present invention, the collector layer and the emitter layer each include a heavily doped thin sublayer having a high impurity concentration, and each of the heavily doped thin sublayers having an impurity concentration greater than those of semiconductor layers adjacent to each heavily doped thin sublayer. Thus, when graded sublayers are disposed between the base layer and the emitter layer and between the base layer and the collector layer, the above-described disadvantages of the incorporation are effectively overcome while the above-described advantages are taken of these graded sublayers. That is, it is possible to sufficiently reduce the offset voltage (Voff) and the knee voltage (Vk) and to suppress degradation in reliability. Furthermore, a base contact can be easily formed.

Such advantages will be described in more detail below by means of specific structural examples.

The presence of conduction band discontinuity between the base layer and the collector layer due to the collector layer having an electron affinity lower than that of the base layer inhibits the flow of a current. To prevent this inhibition, for example, a uniform graded sublayer may need to be disposed between the base layer and the collector layer to smoothly connect potential levels at the conduction band edges of the base layer and the collector layer. An HBT mainly composed of InP and InGaAs is exemplified here and will be described below.

FIG. 3 is an energy band diagram of a HBT including an emitter layer (E) composed of InP, a base layer (B) composed of InGaAs, and a collector layer (C) composed of InP and not including a graded sublayer or the like disposed between the emitter layer and the base layer and between the base layer and the collector layer (type-A HBT), wherein Ec represents a conduction band energy level and Ev represents a valence band energy level. FIGS. 4A and 4B are each an energy band diagram in the case where a graded sublayer is disposed between the base layer and the collector layer (type-B HBT). FIG. 4B is an energy band diagram when a voltage is applied. As shown in this diagram, even in the case where the graded sublayer is disposed, when the base-collector junction is forward-biased, the potential barrier at the base-collector junction recovers slightly. This has a slight effect on the Ic-Vce characteristics.

This problem can be prevented by incorporating the graded sublayer and the heavily doped thin sublayer between the base layer and the collector layer. However, disadvantageously, the forward turn-on voltage (Vbc-on) of the base-collector pn junction decreases, and the offset voltage (Voff) increases.

FIGS. 5A and 5B are each an energy band diagram of a HBT (type-C HBT) including a graded sublayer and a heavily doped thin sublayer between the base layer and the collector layer. FIG. 6 is a graph showing the Ic-Vce characteristics of the type-B HBT and the type-C HBT. As shown in FIG. 5B, in the type-C HBT, even when the base-collector junction is forward-biased, the recovery of the potential barrier at the base-collector junction is suppressed. As a result, as shown in FIG. 6, the resistance when Ic starts to flow slightly decreases, but Voff increases.

To reduce Voff, there is provided a type-D HBT having a structure in which a graded sublayer is disposed between the emitter layer and the base layer of the type-B HBT. As shown in FIG. 7 depicting the Ic-Vce characteristics, as compared with the type-B HBT, Voff decreases, but the resistance when Ic starts to flow increases.

On the other hand, use of the above-described emitter ledge structure including the graded sublayer disposed between the emitter layer and the base layer leads to the following problems. That is, although the graded sublayer having a smaller thickness is preferred in view of the formation of a base contact (type-F HBT), the turn-on voltage (Vbe-on) of the emitter-base junction increases with decreasing thickness, thereby increasing Voff and Vk. This example will be described in an embodiment described below. In contrast, an increase in the thickness of the graded sublayer makes it more difficult to form the base contact by alloying.

However, the increase in Voff with a decrease in the thickness of the graded sublayer disposed between the emitter layer and the base layer can be prevented by incorporating the heavily doped thin sublayer between the emitter layer and the base layer. FIG. 13 is an energy band diagram of a HBT (type-G HBT) including a graded sublayer and a heavily doped thin sublayer between the emitter layer and the base layer. FIG. 14 shows the Ic-Vce characteristics of the type-G HBT as compared with the type-F HBT. As is apparent from the figure showing the Ic-Vce characteristics, Voff of the type-G HBT is smaller than that of the type-F HBT, which is desirable.

BRIEF DESCRIPTION OF THE DRAWINGS

FIG. 5 is a band diagram of a type-C HBT for illustrating a HBT according to an embodiment of the present invention;

FIG. 8 is a band diagram of a type-D HBT for illustrating a HBT according to an embodiment of the present invention;

DESCRIPTION OF THE PREFERRED EMBODIMENTS

Figure 1:
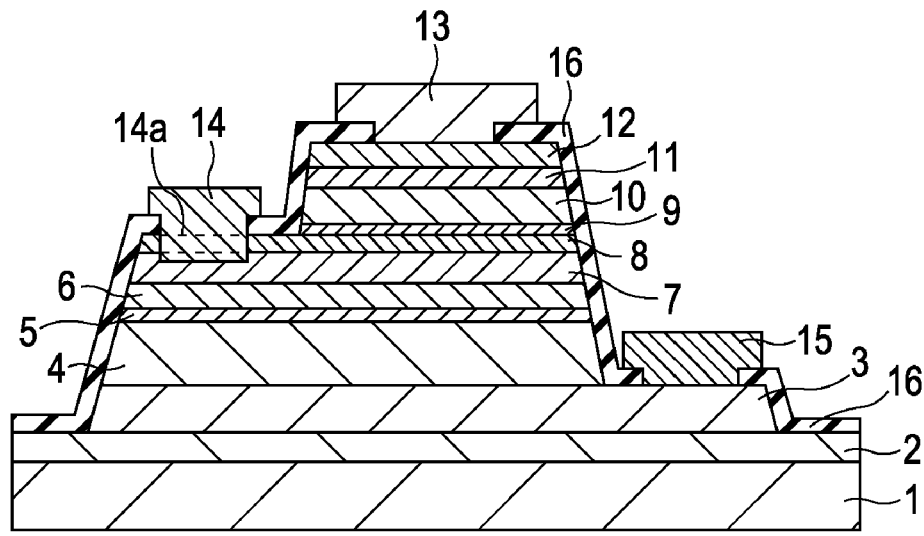
FIG. 1 is a cross-sectional view of a HBT according to a first embodiment of the present invention.

In an embodiment of the present invention, to express the above-described effect, desirably, the heavily doped thin sublayer included in the emitter layer has a sheet carrier concentration of $3 \times 10^{11}$ cm$^{-2}$ or more; and the heavily doped thin sublayer included in the collector layer has a sheet carrier concentration of $1.5 \times 10^{11}$ cm$^{-2}$ or more. In this case, the heavily doped thin sublayer included in the emitter layer preferably has a sheet carrier concentration higher than that of the heavily doped thin sublayer included in the collector layer.

Each of the emitter layer and the collector layer preferably includes a sublayer in which the sum of the electron affinity and the band gap of the sublayer is greater than that of the base layer. These sublayers each function to suppress the injection of holes from the base layer to the emitter layer or to the collector layer. Thus, the sublayers are referred to as "hole-blocking sublayers". A hole-blocking sublayer included in the emitter layer is referred to as a "first emitter sublayer". A hole-blocking sublayer included in the collector layer is referred to as a "first collector sublayer". Preferably, the heavily doped thin sublayer included in the emitter layer is in contact with the first emitter sublayer and is composed of the same material as the first emitter sublayer. Preferably, the heavily doped thin sublayer included in the collector layer is in contact with the first collector sublayer and is composed of the same material as the first collector sublayer.

Furthermore, graded sublayers having graded electron affinity due to a change in semiconductor composition (composition modulation) are desirably disposed between the heavily doped thin sublayer included in the emitter layer and the base layer and between the heavily doped thin sublayer included in the collector layer and the base layer.

That is, preferably, the electron affinity of each graded sublayer approaches the electron affinity of the base layer with increasing proximity to the base layer and approaches the electron affinity of the hole-blocking sublayer with increasing proximity to the hole-blocking sublayer, thereby smoothly connecting the electron affinity at junctions of these layers. At least a structure similar to the structure is preferably used.

In this case, the graded sublayer disposed between the emitter layer and the base layer preferably has a thickness of 15 nm or less. This layer is also used for not exposing the surface of the emitter-base junction and is thus difficult to have a significantly small thickness. However, a thinner graded sublayer is more desirable in view of the formation of a base contact. It is confirmed that a thickness of about 10 nm is suitable.

In some cases, the first collector sublayer disadvantageously has low mobility. In this case, a second collector sublayer having mobility greater than that of the first collector sublayer may be disposed between the first collector sublayer and a subcollector layer.

A HBT according to an embodiment of the present invention preferably has a basic structure.

The emitter layer includes the graded sublayer, the heavily doped thin sublayer, the first emitter sublayer, the second emitter sublayer having an impurity concentration greater than that of the first emitter sublayer, and an emitter cap sublayer having a composition or a material different from that of the second emitter sublayer and having high impurity concentration. Any other sublayer may be incorporated. For example, a third emitter sublayer having an impurity concentration greater than that of the second emitter sublayer may be disposed between the second emitter sublayer and the emitter cap sublayer.

The base layer contains an impurity in high concentration, the impurity having a conductivity type opposite to the conductivity type of the emitter layer and the subcollector layer.

The collector layer includes the graded sublayer, the heavily doped thin sublayer, and the first collector sublayer. Any other sublayer may be incorporated. For example, a second collector sublayer having a composition or a material different from that of the first collector sublayer may be disposed between the first collector sublayer and the subcollector layer. Furthermore, a lightly doped sublayer having a uniform composition may be disposed between the graded sublayer and the base layer. A sublayer for smoothly connecting the first and second collector sublayers may be disposed between the first collector sublayer and the second collector sublayer.

In this HBT, a heavily doped, low-resistance subcollector layer is disposed on a semiconductor substrate. The collector layer, the base layer, and the emitter layer are disposed on the subcollector layer. Electrodes are in ohmic contact with the collector layer, the base layer, and the emitter layer.

A semi-insulating GaAs substrate is desirably used as the semiconductor substrate. Alternatively, the semiconductor substrate may be composed of InP or Si.

A MMIC according to an embodiment of the present invention is an integrated device including the HBT as a main element and passive elements, such as a resistor, a capacitor, and an inductor.

Preferred embodiments of the present invention will be described below with reference to the drawings.

First Embodiment

Figure 2:
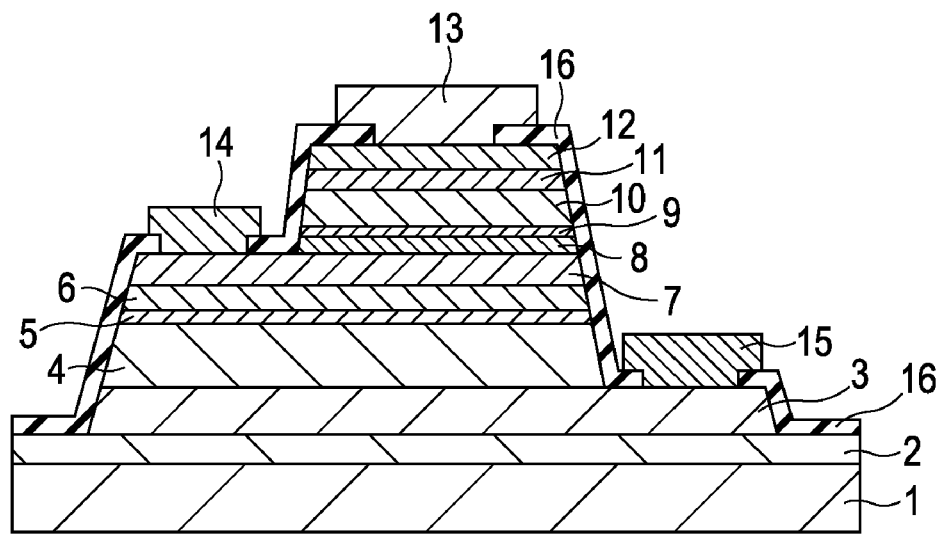
FIG. 2 is a cross-sectional view of the HBT having another structure according to the first embodiment of the present invention.
Figure 3:
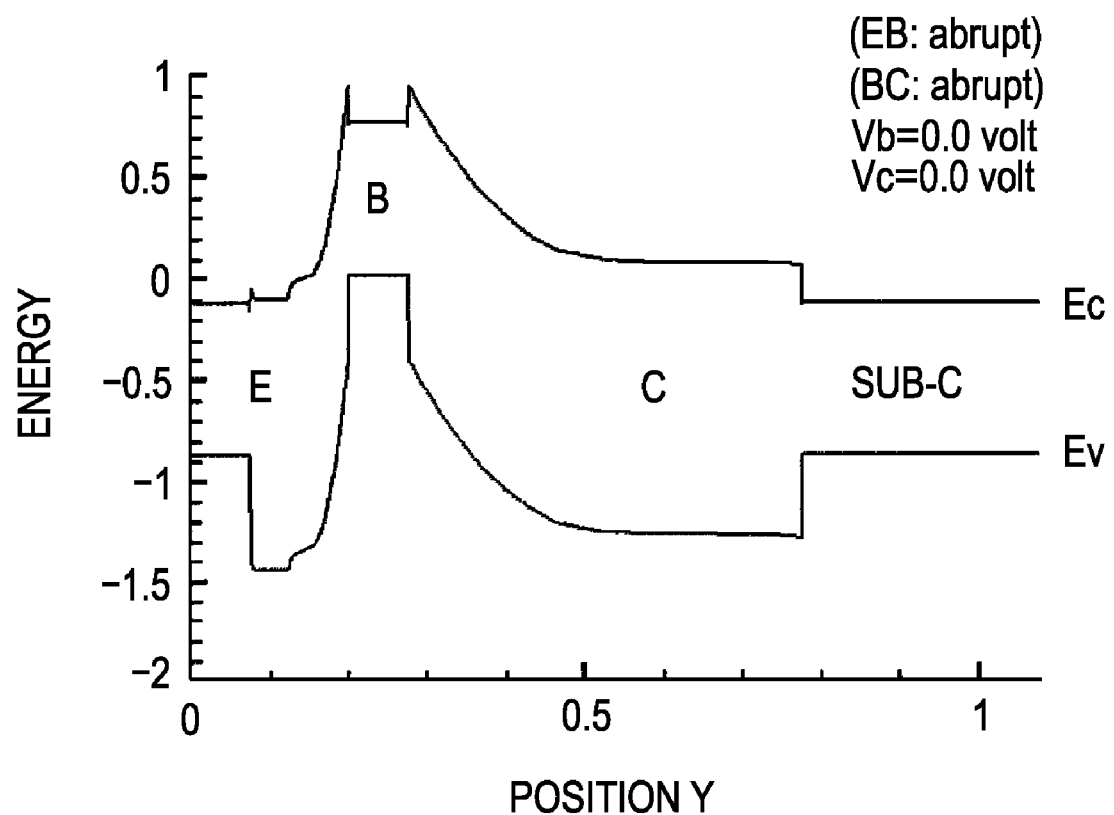
FIG. 3 is a band diagram of a type-A HBT for illustrating a HBT according to an embodiment of the present invention.

FIGS. 1 and 2 are each a cross-sectional view of a double-heterojunction HBT according to a first embodiment.

For example, a buffer layer 2, a subcollector layer 3 composed of $n^+$-type InGaAs, a first collector sublayer 4 (hole-blocking sublayer) composed of $n^-$-type InP, a heavily doped thin sublayer 5 composed of $n^+$-type InP, a graded sublayer 6 composed of $n^-$-type AlInGaAs or the like, a base layer 7 composed of $p^+$-type InGaAs, a graded sublayer 8 composed of $n^-$-type AlInGaAs or the like and having a thickness of about 10 nm, a heavily doped thin sublayer 9 composed of $n^+$-type InP, a first emitter sublayer 10 (hole-blocking sublayer) composed of $n^-$-type InP, a second emitter sublayer 11 composed of $n^+$-type InP, and an emitter cap sublayer 12 composed of $n^+$-type InGaAs are disposed in that order on a semi-insulating semiconductor substrate 1 composed of InP. Furthermore, the surface is covered with an insulating film 16 composed of $Si_3N_4$ or the like, except for portions for forming electrodes.

An emitter electrode 13 is disposed on the emitter cap sublayer 12. To form a base contact, the emitter cap sublayer 12, the second emitter sublayer 11, the first emitter sublayer 10, and the heavily doped thin sublayer 9 are partially removed to form a mesa structure. As shown in FIG. 1, after an emitter ledge structure in which the surface of the base layer 7 is covered with the graded sublayer 8 may be formed by mesa processing, a base electrode 14 may be formed on the graded sublayer 8, and then part of the base electrode 14 may be alloyed with the graded sublayer 8 by heat treatment or the like to form an ohmic contact portion 14a that is in ohmic contact with the base layer 7. Alternatively, as shown in FIG. 2, after the graded sublayer 8 present in a region in which the base electrode 14 will be formed is removed, the base electrode 14 may be formed.

In the formation of a collector electrode 15, the mesa structure is also formed. That is, the collector electrode 15 is formed on the subcollector layer 3.

Each of the emitter electrode 13, the base electrode 14, and the collector electrode 15 may be formed of a Ti/Pt/Au laminate or the like.

The buffer layer 2 is composed of, for example, InGaAs, InAlAs, or InP or in combination thereof.

The subcollector layer 3 has a thickness of 300 to 500 nm and a concentration of $5 \times 10^{18}$ to $2 \times 10^{19}$ cm$^{-3}$ and may be composed of $n^+$-type InP in place of $n^+$-type InGaAs. The first collector sublayer 4 composed of $n^-$-type InP has a thickness of 100 to 700 nm and a concentration of $1 \times 10^{17}$ cm$^{-3}$ or less (sheet doping (carrier) concentration of $5 \times 10^{12}$ cm$^{-2}$ or less). The heavily doped thin sublayer 5 composed of $n^+$-type InP has a thickness of about 5 nm or less and a sheet doping (carrier) concentration of about $5 \times 10^{11}$ cm$^{-2}$. The $n^-$-type graded sublayer 6 has a thickness of 5 to 200 nm and a concentration of $1 \times 10^{17}$ cm$^{-3}$ or less (sheet doping (carrier) concentration of $1 \times 10^{12}$ cm$^{-2}$ or less) and may be composed of InGaAsP in place of AlInGaAs.

The base layer 7 composed of $p^+$-type InGaAs has a thickness of 30 to 100 nm and a concentration of $1 \times 10^{19}$ to $5 \times 10^{19}$ cm$^{-3}$, the In content being 0 to 0.6. The graded sublayer 8 composed of $n^-$-type AlInGaAs has a thickness of about 10 nm (about 15 nm or less) and a concentration of $1 \times 10^{17}$ cm$^{-3}$ or less (sheet doping (carrier) concentration of $2 \times 10^{11}$ cm$^{-2}$ or less). The heavily doped thin sublayer 9 composed of $n^+$-type InP has a thickness of about 5 nm or less and a sheet doping (carrier) concentration of about $1 \times 10^{12}$ cm$^{-2}$.

The first emitter sublayer 10 composed of $n^-$-type InP has a thickness of 5 to 100 nm and a concentration of $1 \times 10^{17}$ to $1 \times 10^{18}$ cm$^{-3}$ (sheet doping (carrier) concentration of $5 \times 10^{10}$ to $1 \times 10^{13}$ cm$^{-2}$). The second emitter sublayer 11 composed of $n^+$-type InP has a thickness of about 50 nm and a concentration of $5 \times 10^{18}$ to $2 \times 10^{19}$ cm$^{-3}$. The emitter cap sublayer 12 composed of $n^+$-type InGaAs has a thickness of about 50 to 100 nm and a concentration of about $1 \times 10^{19}$ to $2 \times 10^{19}$ cm$^{-3}$.

The thickness, concentration, and the like of each of the layers and sublayers are merely examples and not limited to those values.

The first emitter sublayer 10 and the first collector sublayer 4 each function as a hole-blocking sublayer in which the sum of the electron affinity (difference in energy between the standard zero level and a conduction band level Ec) and the band gap (difference between the conduction band level Ec and a valence band level Ev) is greater than that of the base layer 7.

Figure 13A:
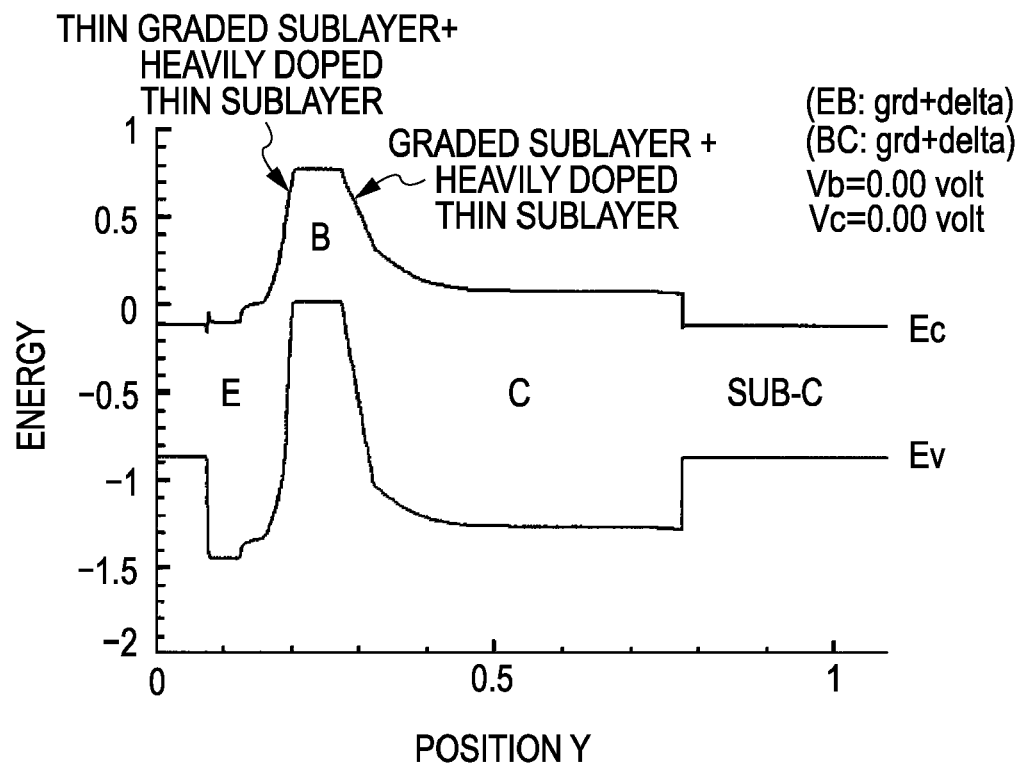
FIG. 13 is a band diagram of a type-G HBT according to an embodiment of the present invention.
Figure 13B:
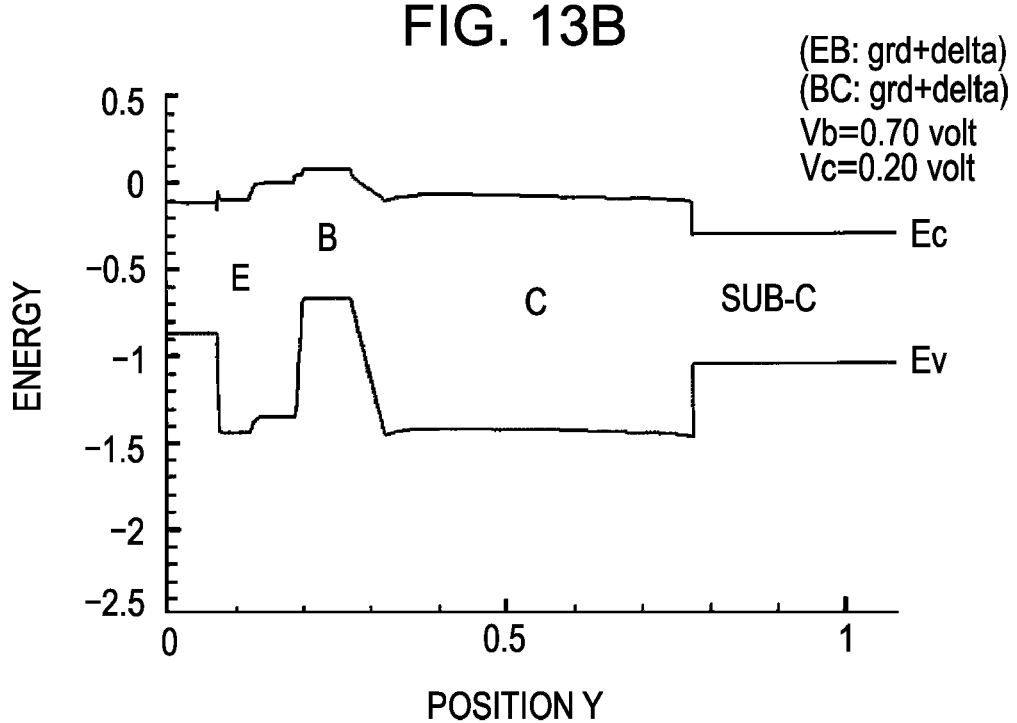

FIGS. 13A and 13B are each an energy band diagram of the HBT shown in FIG. 1 or 2 in the direction perpendicular to the substrate (Y-axis in the figure) and each show the energy levels of the conduction band edge (Ec) and the valence band edge (Ev).

The above-described structure was conceived as follows.

Figure 4A:
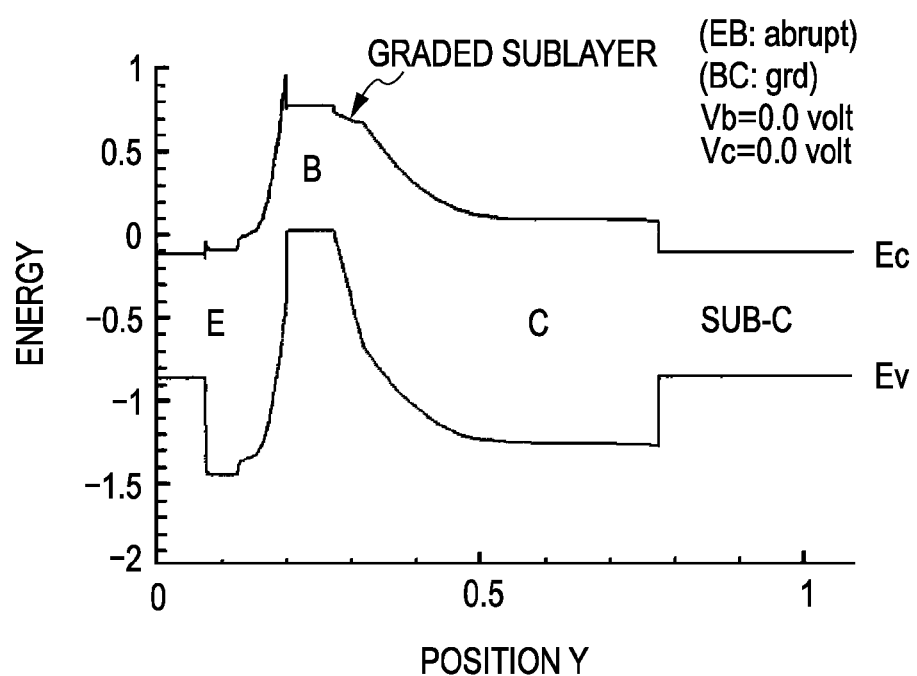
FIG. 4 is a band diagram of a type-B HBT for illustrating a HBT according to an embodiment of the present invention.
Figure 4B:
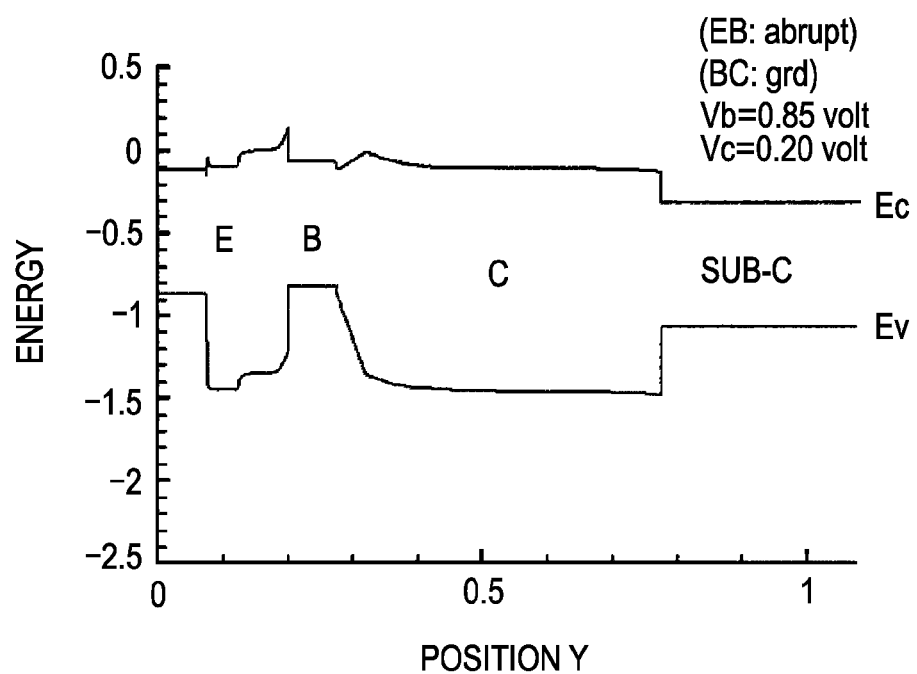
Figure 6:
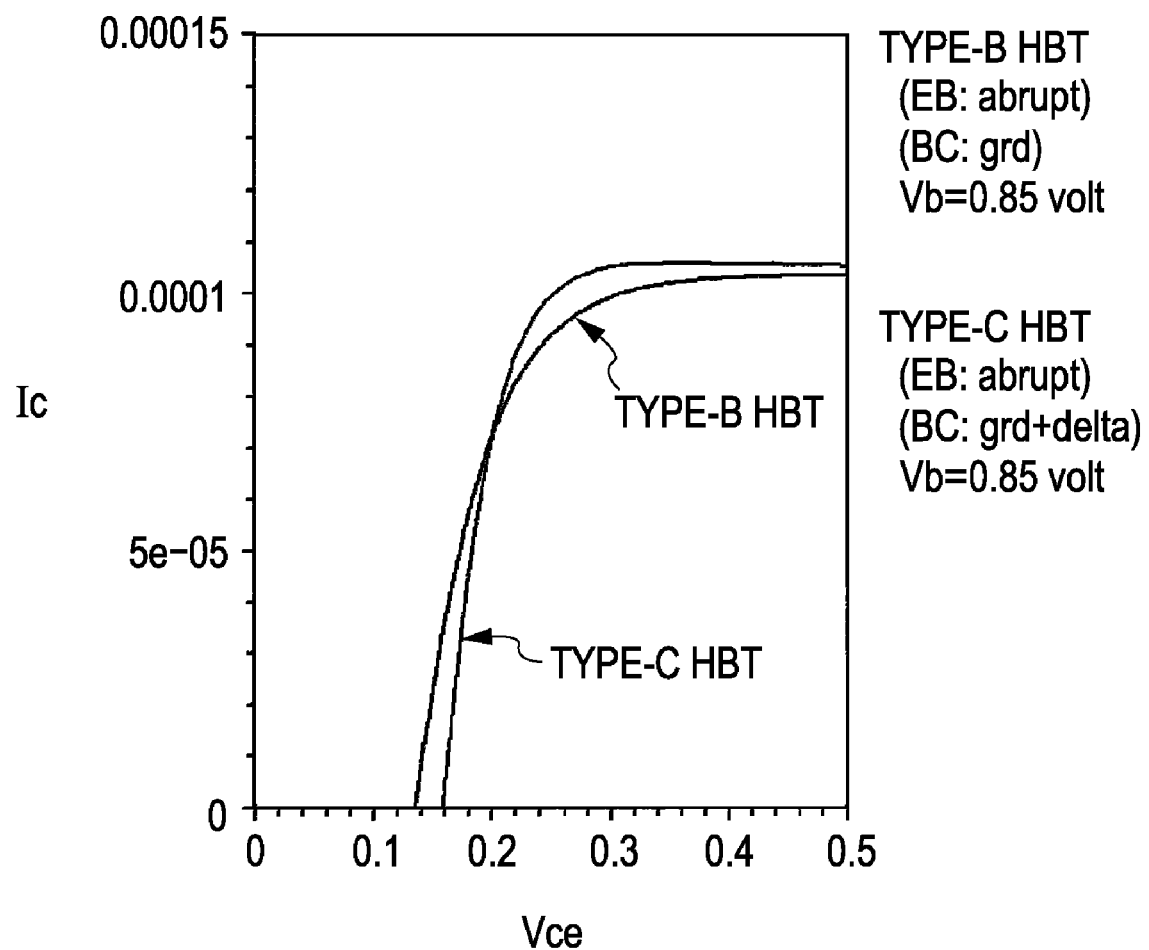
FIG. 6 shows current-voltage characteristics of the type-B HBT and the type-C HBT for illustrating a HBT according to an embodiment of the present invention.

As described above, the influence of the potential barrier generated at the interface between the base layer and the collector layer of the type-A HBT can be prevented to a certain degree by, for example, incorporating the graded sublayer between the InGaAs base layer and the InP collector layer, as the type-B HBT shown in FIG. 4A. When a positive voltage is applied to the base layer and the pn junction between the base layer and the collector layer is forward-biased, the potential barrier is recovered as shown in FIG. 4B.

Figure 7:
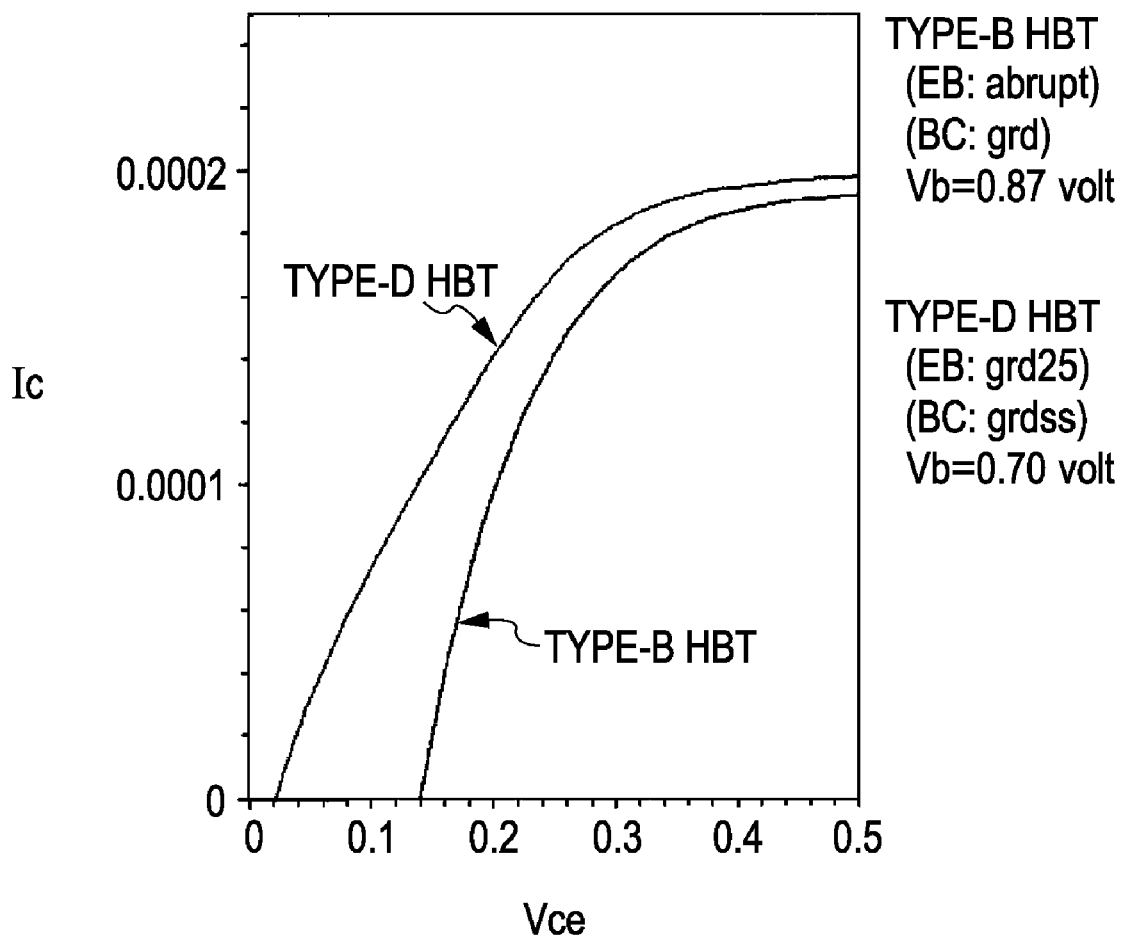
FIG. 7 shows current-voltage characteristics of the type-B HBT and the type-D HBT for illustrating a HBT according to an embodiment of the present invention.

This problem might not be a major problem in the type-B HBT. Because there is a possibility that the energy of hot electrons injected from the emitter layer to the base layer is not sufficiently relieved and is less subject to the influence of the potential barrier. In other words, in the case where the graded sublayer is disposed between the emitter layer and the base layer (type-D HBT), when the pn junction between the base layer and the collector layer is forward-biased, the HBT is more susceptible to the influence of the potential barrier as predicted from FIGS. 8A and 8B each showing a band diagram. The results shown in FIG. 7 support this idea.

Figure 9:
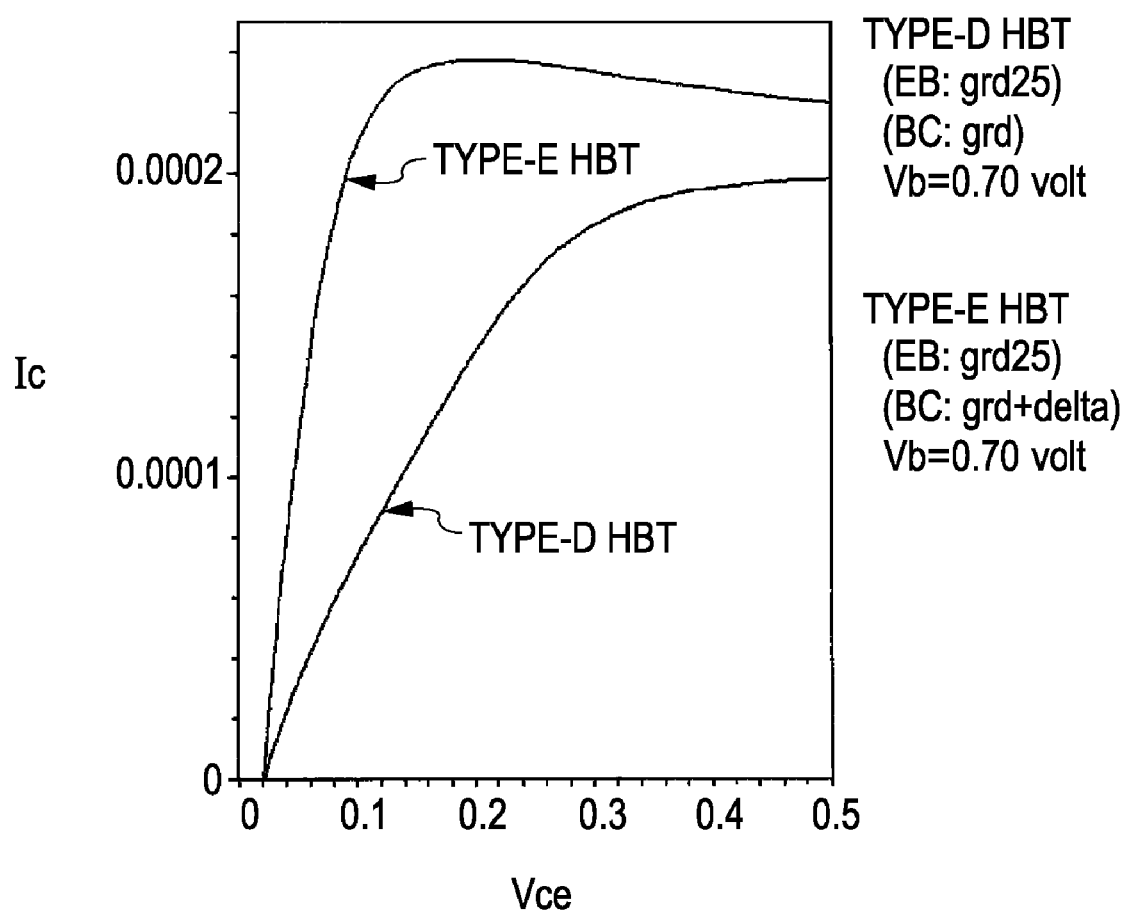
FIG. 9 shows current-voltage characteristics of the type-D HBT and the type-E HBT for illustrating a HBT according to an embodiment of the present invention.
Figure 10A:
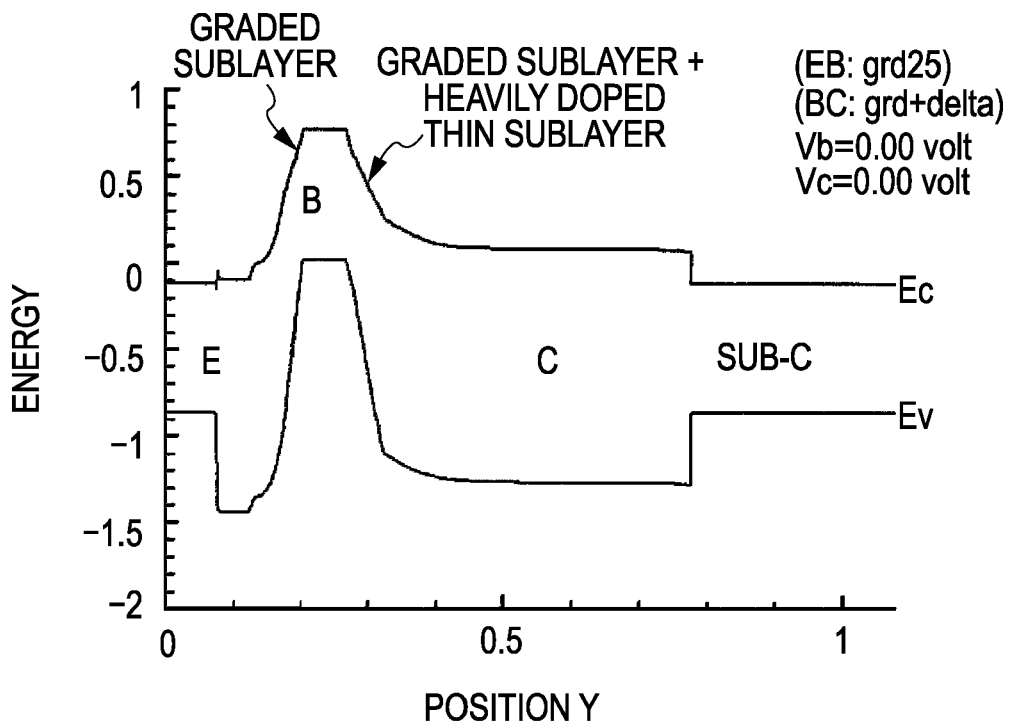
FIG. 10 is a band diagram of a type-E HBT for illustrating a HBT according to an embodiment of the present invention.
Figure 10B:
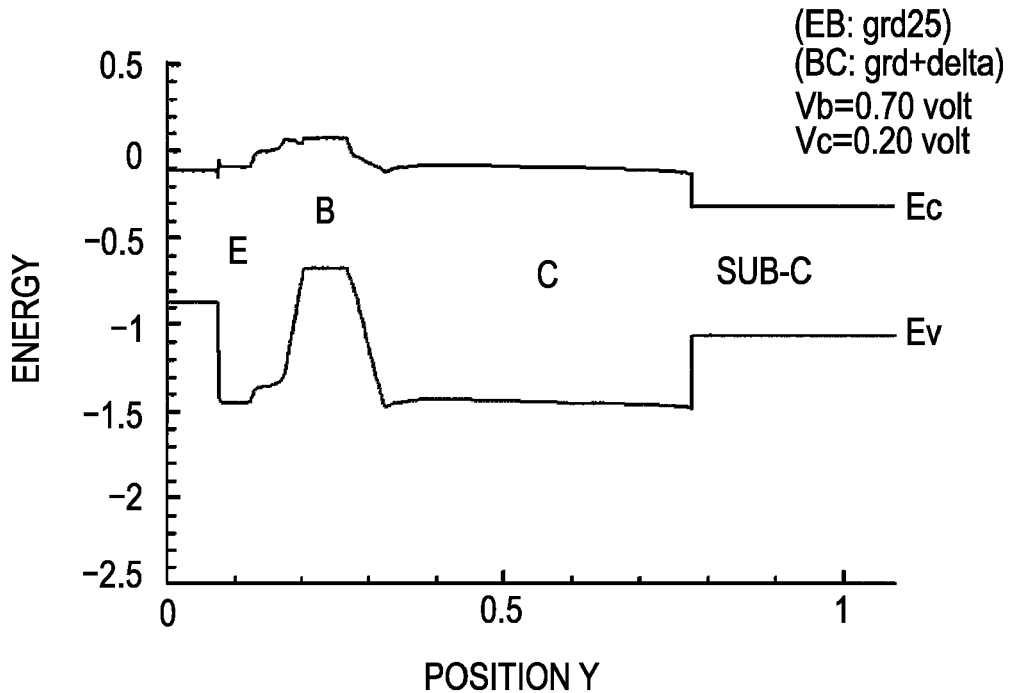

That is, when the graded sublayer is disposed between the emitter layer and the base layer, it may be necessary to dispose the graded sublayer and the heavily doped thin sublayer between the base layer and the collector layer. In fact, when the graded sublayer and the heavily doped thin sublayer are disposed between the base layer and the collector layer (type-E HBT), as is clear from FIG. 9 showing Ic-Vce characteristics, the knee voltage significantly decreases. FIGS. 10A and 10B are each a band diagram of the type-E HBT. In this case, it is found that the potential barrier is not generated at the base-collector junction.

When the graded sublayer is disposed between the emitter layer and the base layer, as described above, the HBT is more susceptible to the influence of the potential barrier generated even when the graded sublayer is disposed between the base layer and the collector layer. This problem is overcome by incorporating the heavily doped thin sublayer 5 between the base layer and the collector layer. The reason for this is as follows: when the graded sublayer is disposed between the emitter layer and the base layer, the average energy of electrons injected from the emitter layer to the base layer is reduced to be more susceptible to the influence of the potential barrier. However, the heavily doped thin sublayer 5 eliminates the potential barrier. As a result, even when electrons are injected from the emitter layer to the base layer at a low energy level, the electrons can readily move from the base layer to the collector layer. In this case, suitable Ron or Vbc-on is obtained, and Voff or Vk can be maintained at a low level.

To ensure reliability, a HBT may generally require a structure for preventing the exposure of the interface between the emitter layer and the base layer, i.e., an emitter ledge structure. That is, the graded sublayer disposed between the emitter layer and the base layer is not completely removed in an external base region, and then the base contact may be formed with the graded sublayer.

Figure 11A:
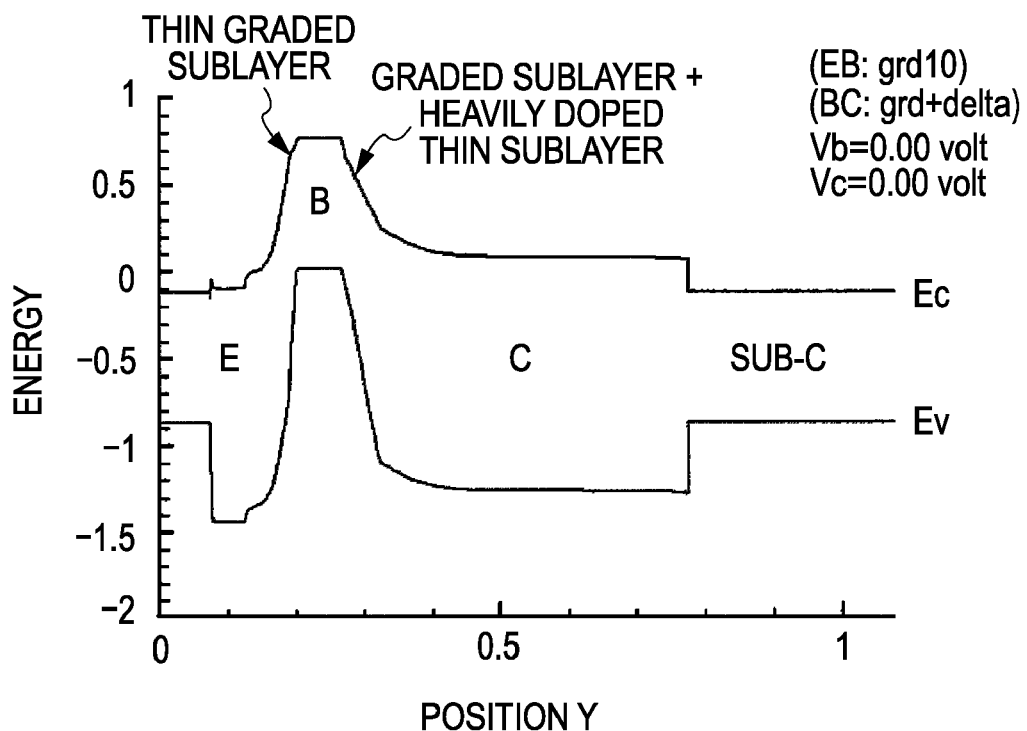
FIG. 11 is a band diagram of a type-F HBT for illustrating a HBT according to an embodiment of the present invention.
Figure 11B:
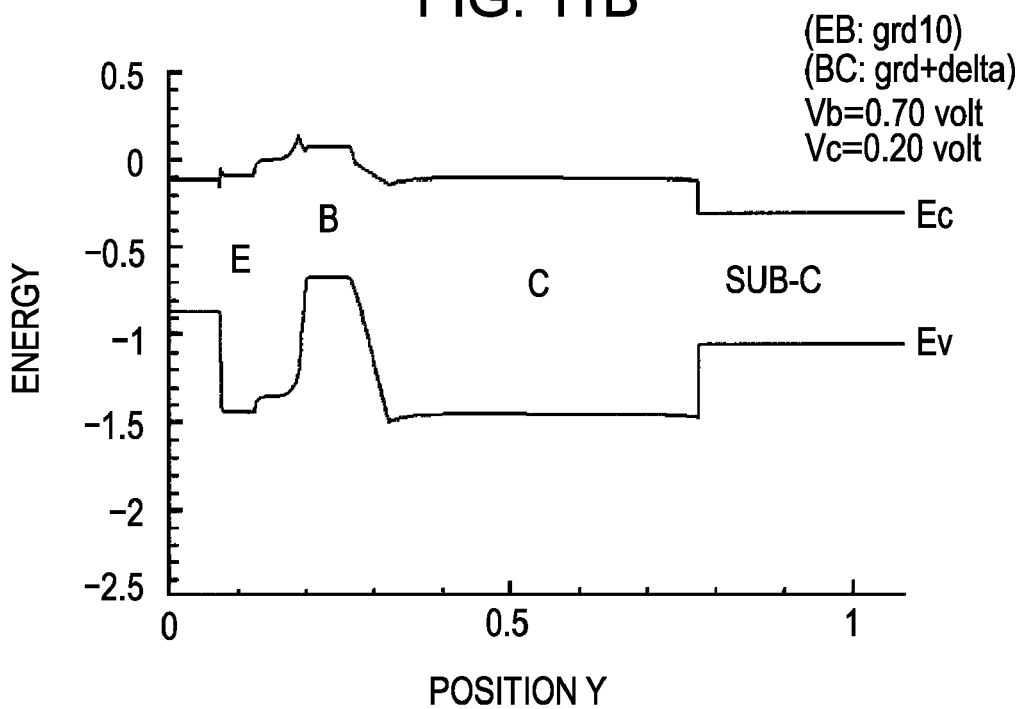
Figure 12:
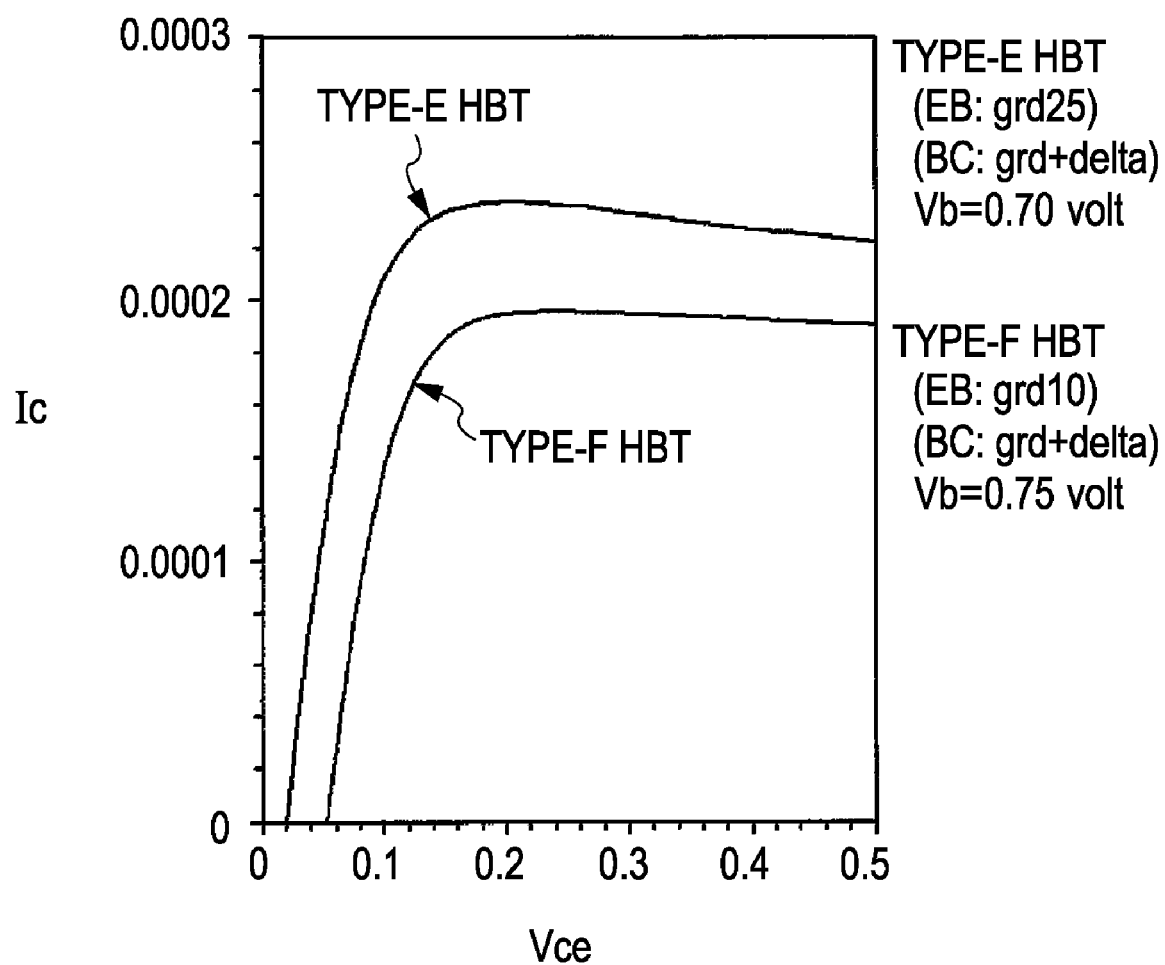
FIG. 12 shows current-voltage characteristics of the type-E HBT and the type-F HBT for illustrating a HBT according to an embodiment of the present invention.

In this case, to facilitate the contact formation, it may be necessary to decrease the thickness of the graded sublayer disposed between the emitter layer and the base layer. FIGS. 11A and 11B are each a band diagram of a type-F HBT having a thickness of the graded sublayer of 10 nm. As is apparent from the figure, when the emitter-base junction is forward-biased, the potential barrier is recovered also at the emitter-base junction. Thus, Voff increases as shown in FIG. 12.

Figure 14:
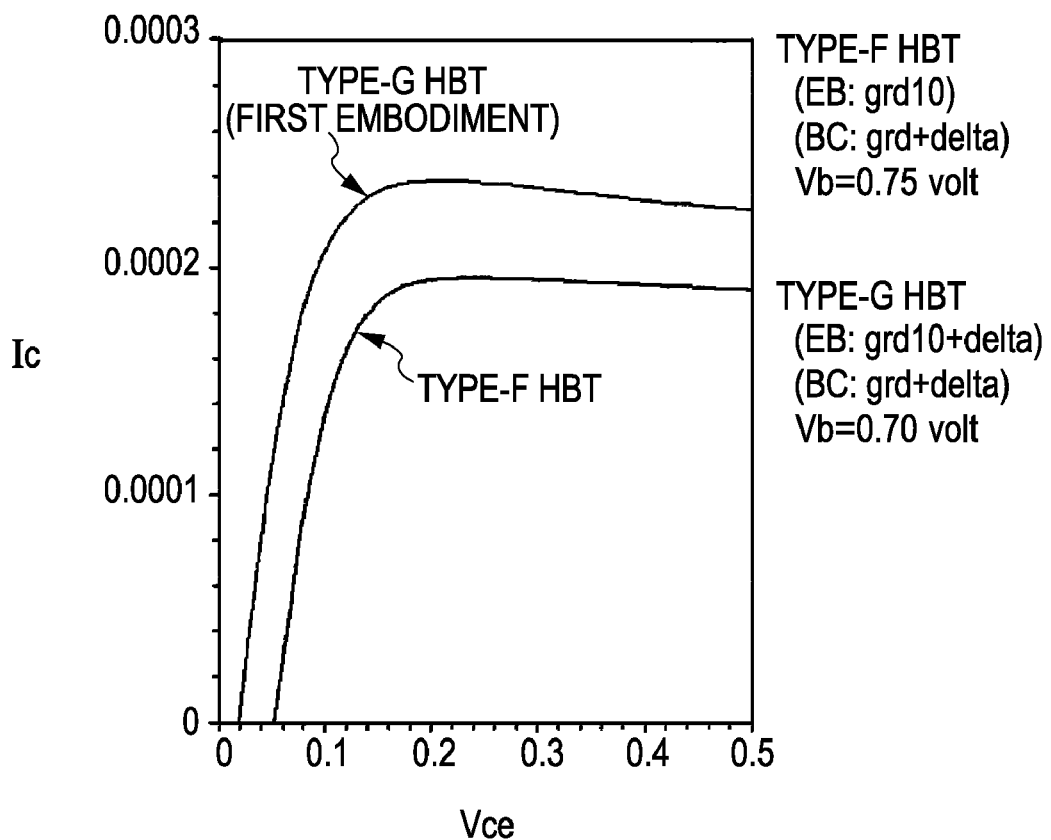
FIG. 14 shows current-voltage characteristics of the type-F HBT and the type-G HBT according to an embodiment of the present invention.

When the graded sublayer having a smaller thickness is disposed between the emitter layer and the base layer, it is desirable to dispose a heavily doped thin sublayer between the emitter layer and the base layer to suppress the increase in Voff. FIGS. 13A and 13B are each a band diagram of a HBT (type-G HBT) having the graded sublayer and the heavily doped thin sublayer that are also disposed between the emitter layer and the base layer. FIG. 14 shows Ic-Vce characteristics of the type-G HBT as compared with the type-F HBT. As shown in the figure, the type-G HBT exhibits the Ic-Vce characteristics similar to those of the type-E HBT. The type-G HBT is a HBT corresponding to the first embodiment.

As described above, the graded sublayer disposed between the emitter layer and the base layer desirably has a thickness of about 10 nm (about 15 nm or less) in view of ease of the contact formation. Furthermore, the heavily doped thin sublayers disposed between the emitter layer and the base layer and between the base layer and the collector layer desirably have sheet doping concentrations of $3 \times 10^{11}$ cm$^{-2}$ or more and $1.5 \times 10^{11}$ cm$^{-2}$ or more, respectively. These values are each determined as the minimum concentration required for suppressing a significant degradation in offset voltage by a simulation.

In this embodiment, although the collector layer includes the graded sublayer 6, the heavily doped thin sublayer 5, and the first collector sublayer 4, other sublayers may be disposed between the graded sublayer 6 and the base layer 7 and between the first collector sublayer 4 and the subcollector layer 3.

Second Embodiment

Figure 15:
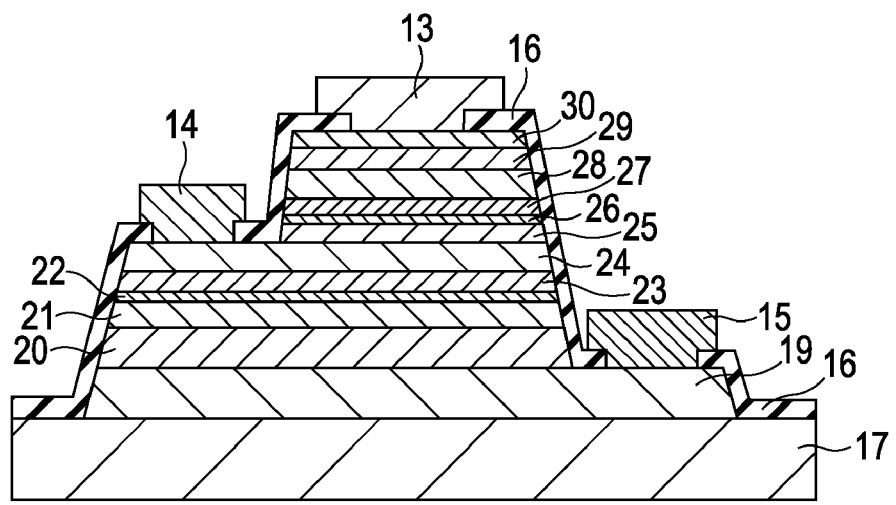
FIG. 15 is a cross-sectional view of a HBT according to a second embodiment of the present invention.

FIG. 15 is a cross-sectional view of a double-heterojunction bipolar transistor according to a second embodiment.

For example, a subcollector layer 19 composed of n$^+$-type GaAs, a second collector sublayer 20 composed of n$^-$-type GaAs, a first collector sublayer 21 (hole-blocking sublayer) composed of n$^-$-type AlGaAs, a heavily doped thin sublayer 22 composed of n$^+$-type AlGaAs, a graded sublayer 23 composed of n$^-$-type AlGaAs or the like, a base layer 24 composed of p$^+$-type GaAs, a graded sublayer 25 composed of n$^-$-type AlGaAs or the like and having a thickness of about 10 nm, a heavily doped thin sublayer 26 composed of n$^+$-type InGaP, a first emitter sublayer 27 (hole-blocking sublayer) composed of n$^-$-type InGaP, a second emitter sublayer 28 composed of n$^-$-type AlGaAs, a third emitter sublayer 29 composed of n$^+$-type GaAs, and an emitter cap sublayer 30 composed of n$^+$-type InGaAs are laminated in that order on a semi-insulating GaAs semiconductor substrate 17.

The emitter electrode 13 is disposed on the emitter cap sublayer 30. To form a base contact, the emitter cap sublayer 30, the third emitter sublayer 29, the second emitter sublayer 28, the first emitter sublayer 27, and the heavily doped thin sublayer 26 are partially removed to form a mesa structure. The base electrode 14 may be formed on the graded sublayer 25 in the same way as shown in FIG. 1, and then an alloyed layer mainly composed of elements constituting the base electrode 14 and the graded sublayer 25 is formed between the base electrode 14 and the base layer 24 by heat treatment to form an ohmic contact with the base layer 24. Alternatively, in the same way as shown in FIG. 2 (as shown in FIG. 15), the graded sublayer 25 present directly below the base electrode 14 is removed, and then an ohmic contact may be directly formed on the base layer 24.

In the formation of the collector electrode 15, the mesa structure is also formed. That is, the collector electrode 15 is formed on the subcollector layer 19.

Each of the emitter electrode 13, the base electrode 14, and the collector electrode 15 is formed of, for example, a Ti/Pt/Au laminate.

The semiconductor surface that is not in contact with the electrodes is covered with the insulating film 16 composed of $Si_3N_4$ or the like.

The subcollector layer 19 composed of $n^+$-type GaAs has a thickness of about 300 to 500 nm and a concentration of about $5 \times 10^{18}$ to $2 \times 10^{19}$ cm$^{-3}$. The second collector sublayer 20 composed of $n^-$-type GaAs has a thickness of about 100 to 700 nm and a concentration of about $1 \times 10^{16}$ to $1 \times 10^{17}$ cm$^{-3}$. The first collector sublayer 21 composed of $n^-$-type AlGaAs has a thickness of about 10 to 100 nm and a concentration of about $1 \times 10^{16}$ to $1 \times 10^{17}$ cm$^{-3}$ (sheet doping concentration of about $1 \times 10^{10}$ to $1 \times 10^{12}$ cm$^{-2}$). The heavily doped thin sublayer 22 composed of $n^+$-type AlGaAs has a thickness of 5 nm or less and a sheet doping concentration of about $5 \times 10^{11}$ cm$^{-2}$. The graded sublayer 23 composed of $n^-$-type AlGaAs has a thickness of about 10 to 50 nm and a concentration of about $1 \times 10^{16}$ cm$^{-3}$ to $1 \times 10^{17}$ cm$^{-3}$ (sheet doping concentration of about $1 \times 10^{10}$ to $5 \times 10^{11}$ cm$^{-2}$.

The base layer 24 composed of $p^+$-type GaAs has a thickness of about 30 to 100 nm and a concentration of about $1 \times 10^{19}$ to $5 \times 10^{19}$ cm$^{-2}$. The graded sublayer 25 composed of $n^-$-type AlGaAs has a thickness of about 10 nm and a concentration of $1 \times 10^{17}$ cm$^{-3}$ (sheet doping concentration of about $2 \times 10^{11}$ cm$^{-2}$) or less. The heavily doped thin sublayer 26 composed of $n^+$-type InGaP has a thickness of about 5 nm and a sheet doping concentration of about $1 \times 10^{12}$ cm$^{-2}$.

The first emitter sublayer 27 composed of $n^-$-type InGaP has a thickness of about 5 to 100 nm and a concentration of about $1 \times 10^{17}$ to $1 \times 10^{18}$ cm$^{-3}$ (sheet doping concentration of about $1 \times 10^{11}$ to $1 \times 10^{13}$ cm$^{-2}$). The second emitter sublayer 28 composed of $n^-$-type AlGaAs has a thickness of about 50 to 200 nm and a concentration of about $1 \times 10^{17}$ cm$^{-3}$ or more. The Al composition in the second emitter sublayer 28 is modulated so as to smoothly connect the potential of the first emitter sublayer 27 with the potential of the third emitter sublayer 29. The concentration may not be uniform. The third emitter sublayer 29 composed of $n^+$-type GaAs has a thickness of about 50 nm and a concentration of about $5 \times 10^{18}$ to $2 \times 10^{19}$ cm$^{-3}$. The emitter cap sublayer 30 composed of $n^+$-type InGaAs has a thickness of about 50 nm and a concentration of about $1 \times 10^{19}$ to $2 \times 10^{19}$ cm$^{-3}$.

Figure 16A:
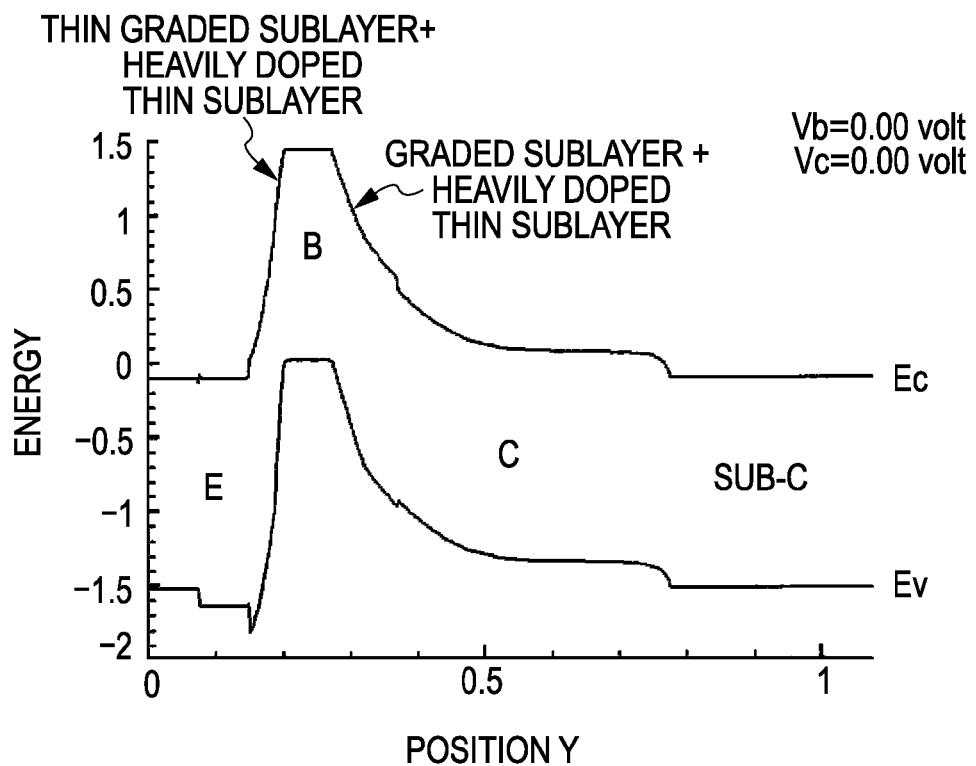
FIG. 16 is a band diagram of the HBT according to the second embodiment of the present invention.
Figure 16B:
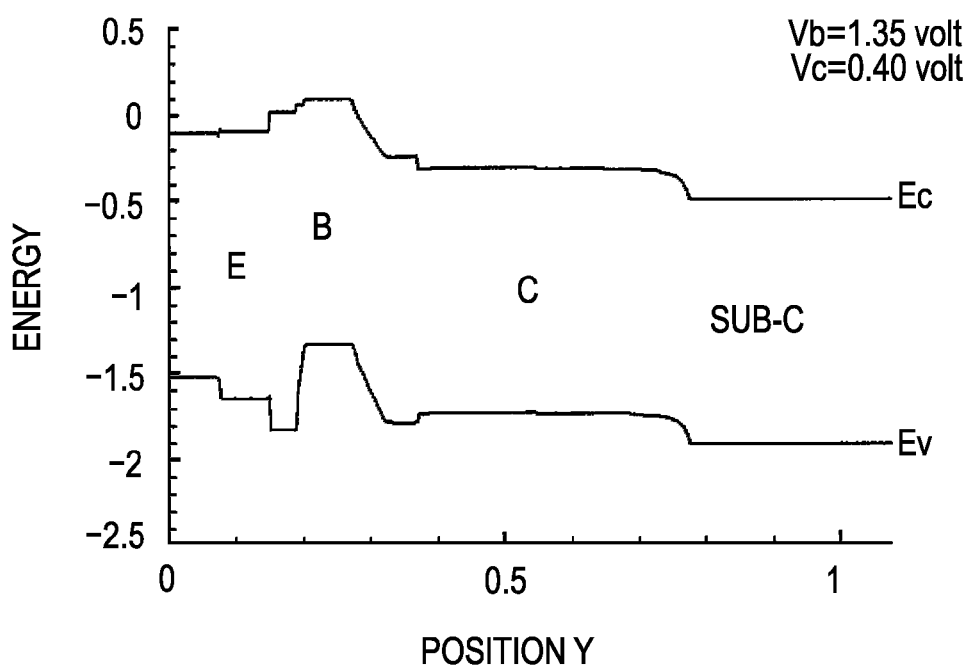

FIG. 16A and 16B are each an energy band diagram of the HBT shown in FIG. 15 in the direction perpendicular to the substrate and each show the energy levels of the conduction band Ec and the valence band Ev.

The first emitter sublayer 27 and the first collector sublayer 21 each function as a hole-blocking sublayer in which the sum of the electron affinity (difference in energy between the standard zero level and a conduction band level Ec) and the band gap (difference between the conduction band level Ec and a valence band level Ev) is greater than that of the base layer 24.

Furthermore, the first collector sublayer 21 disadvantageously has low mobility. However, since the second collector sublayer 20 having mobility greater than that of the first collector sublayer 21 is disposed between the first collector sublayer 21 and the subcollector layer 19, the mobility (operation speed) in the collector layer is sufficient. This is because the collector layer includes the hole-blocking sublayer 21 in which the sum of the electron affinity and the band gap thereof is greater than that of the base layer 24; and the second collector sublayer 20 in which the sum of the electron affinity and the band gap thereof is smaller than that of the hole-blocking sublayer 21.

In addition, the effects described in the first embodiment are also obtained.

Third Embodiment

Figure 17:
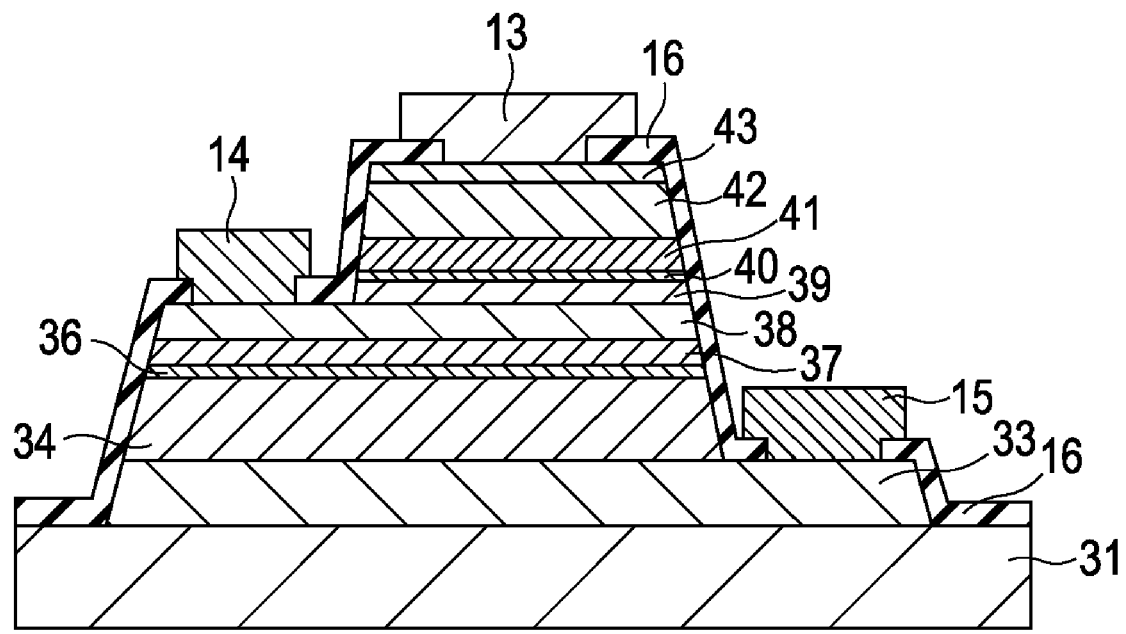
FIG. 17 is a cross-sectional view of a HBT according to a third embodiment of the present invention.

FIG. 17 is a cross-sectional view of a double-heterojunction bipolar transistor according to a third embodiment.

In this embodiment, the double-heterojunction bipolar transistor is disposed on a GaAs substrate, is mainly composed of GaAs, and includes a base layer having electron affinity greater than that of GaAs. For example, a subcollector layer 33 composed of $n^+$-type GaAs, a collector layer 34 composed of $n^-$-type GaAs, a heavily doped thin sublayer 36 composed of $n^+$-type GaAs, a graded sublayer 37 composed of $n^-$-type InGaAs or the like, a base layer 38 composed of $p^+$-type InGaAs, a graded sublayer 39 composed of $n^-$-type AlInGaAs or the like and having a thickness of about 10 nm, a heavily doped thin sublayer 40 composed of $n^+$-type InGaP, a first emitter sublayer 41 composed of $n^-$-type InGaP, a second emitter sublayer 42 composed of n-type GaAs, and an emitter cap sublayer 43 composed of $n^+$-type InGaAs are laminated in that order on a semi-insulating GaAs semiconductor substrate 31.

The emitter electrode 13 is disposed on the emitter cap sublayer 43. To form a base contact, the emitter cap sublayer 43, the second emitter sublayer 42, the first emitter sublayer 41, and the heavily doped thin sublayer 40 are partially removed to form a mesa structure. The base electrode 14 may be formed on the graded sublayer 39 in the same way as shown in FIG. 1, and then an alloyed layer mainly composed of elements constituting the base electrode 14 and the graded sublayer 39 is formed between the base electrode 14 and the base layer 38 by heat treatment to form an ohmic contact with the base layer 38. Alternatively, in the same way as shown in FIG. 2 (as shown in FIG. 17), the graded sublayer 39 present directly below the base electrode 14 may be removed, and then an ohmic contact may be directly formed on the base layer 38.

In the formation of the collector electrode 15, the mesa structure is also formed. That is, the collector electrode 15 is formed on the subcollector layer 33.

Each of the emitter electrode 13, the base electrode 14, and the collector electrode 15 is formed of, for example, a Ti/Pt/Au laminate.

The semiconductor surface that is not in contact with the electrodes is covered with the insulating film 16 composed of $Si_3N_4$ or the like.

The subcollector layer 33 composed of $n^+$-type GaAs has a thickness of about 300 to 500 nm and a concentration of about $5 \times 10^{18}$ to $2 \times 10^{19}$ cm$^{-3}$. The collector layer 34 composed of $n^-$-type GaAs has a thickness of about 300 to 700 nm and a concentration of about $1 \times 10^{16}$ to $1 \times 10^{17}$ cm$^{-3}$. The heavily doped thin sublayer 36 composed of $n^+$-type GaAs has a thickness of about 5 nm or less and a sheet doping concentration of about $5 \times 10^{11}$ cm$^{-2}$. The graded sublayer 37 composed of $n^-$-type InGaAs has a thickness of about 10 to 50 nm and a concentration of about $1 \times 10^{16}$ to $1 \times 10^{17}$ cm$^{-3}$ (sheet doping concentration of about $1 \times 10^{10}$ to $5 \times 10^{11}$ cm$^{-2}$.

The base layer 38 composed of p$^+$-type InGaAs has a thickness of about 30 to 100 nm and a concentration of about $1\times10^{19}$ to $5\times10^{19}$ cm$^{-3}$. The graded sublayer 39 composed of n$^-$-type AlInGaAs has a thickness of about 10 nm and a concentration of $1\times10^{17}$ cm$^{-3}$ or less (sheet doping concentration of $2\times10^{11}$ cm$^{-2}$ or less). The heavily doped thin sublayer 40 composed of n$^+$-type InGaP has a thickness of about 5 nm or less and a sheet doping concentration of about $1\times10^{12}$ cm$^{-2}$.

The first emitter sublayer 41 composed of n$^-$-type InGaP has a thickness of about 5 to 50 nm and a concentration of $1\times10^{17}$ to $1\times10^{18}$ cm$^{-3}$ (sheet doping concentration of $5\times10^{10}$ to $5\times10^{12}$ cm$^{-2}$). The second emitter sublayer 42 composed of n-type GaAs has a thickness of about 50 to 200 nm and a concentration of about $1\times10^{17}$ cm$^{-3}$ or more. The concentration of the second emitter sublayer 42 may not be uniform. An AlGaAs sublayer may be disposed between the first emitter sublayer 41 and the second emitter sublayer 42 so as to smoothly connect the potential of the first emitter sublayer 41 with the potential of the second emitter sublayer 42. The emitter cap sublayer 43 composed of n$^+$-type InGaAs has a thickness of about 50 nm and a concentration of about $1\times10^{19}$ to $2\times10^{19}$ cm$^{-3}$.

In this embodiment, the base layer is composed of InGaAs. Alternatively, the base layer may be composed of another material, such as GaInNAs or GaAsSb, having electron affinity greater than that of GaAs. Furthermore, in this embodiment, the HBT is disposed on the GaAs substrate and is mainly composed of GaAs. Alternatively, the HBT may be mainly composed of a material having a lattice constant different from that of GaAs by incorporating an appropriate buffer layer between the GaAs substrate 31 and the subcollector layer 33.

Figure 18A:
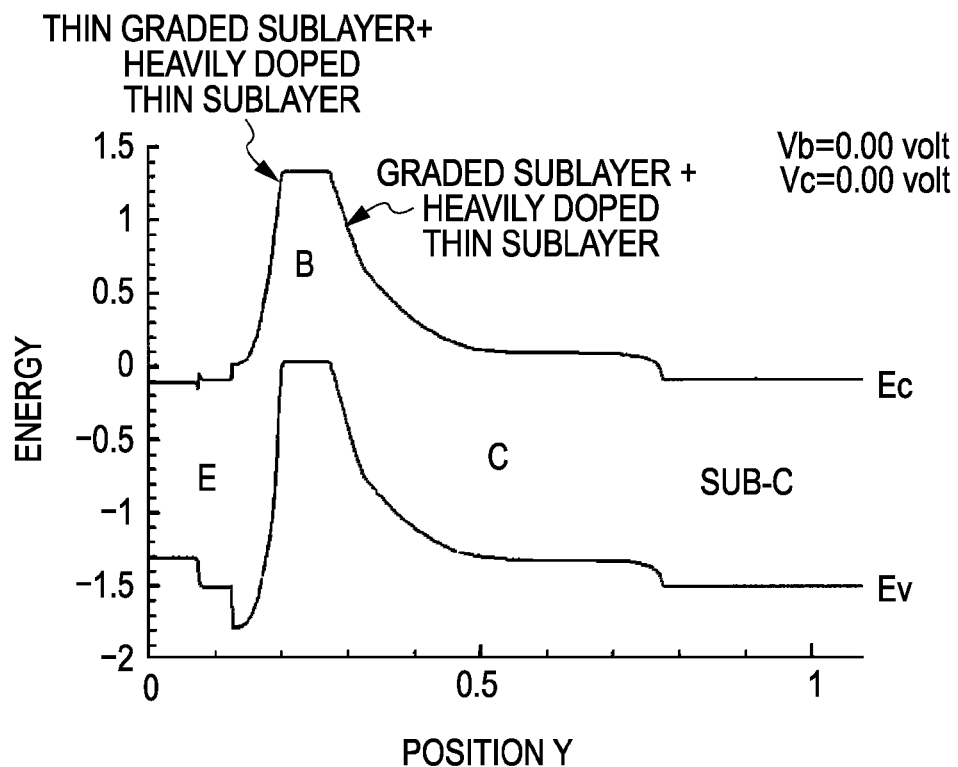
FIG. 18 is a band diagram of the HBT according to the third embodiment of the present invention.
Figure 18B:
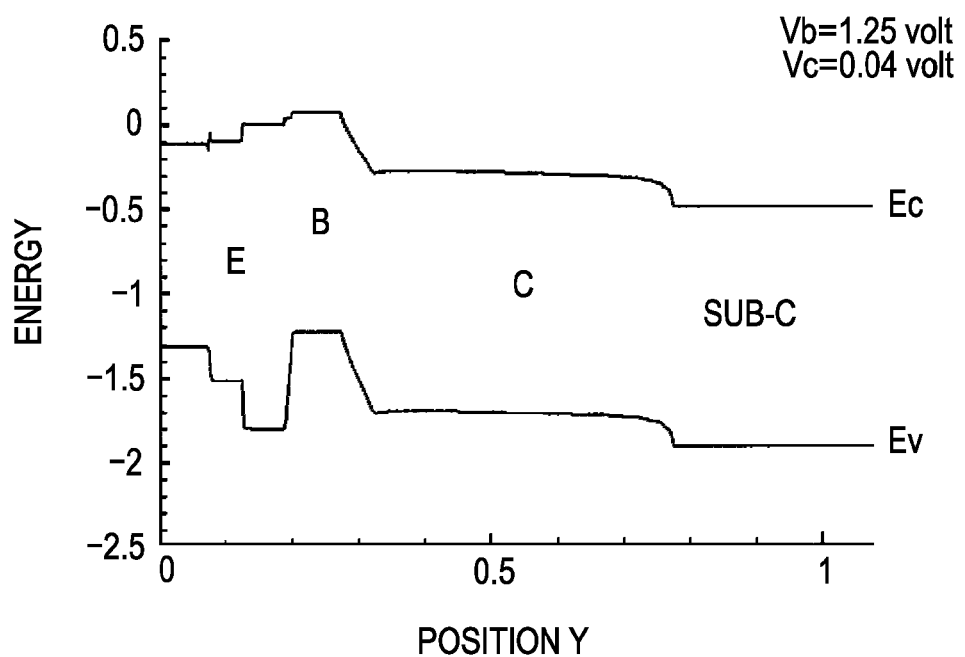
Figure 19:
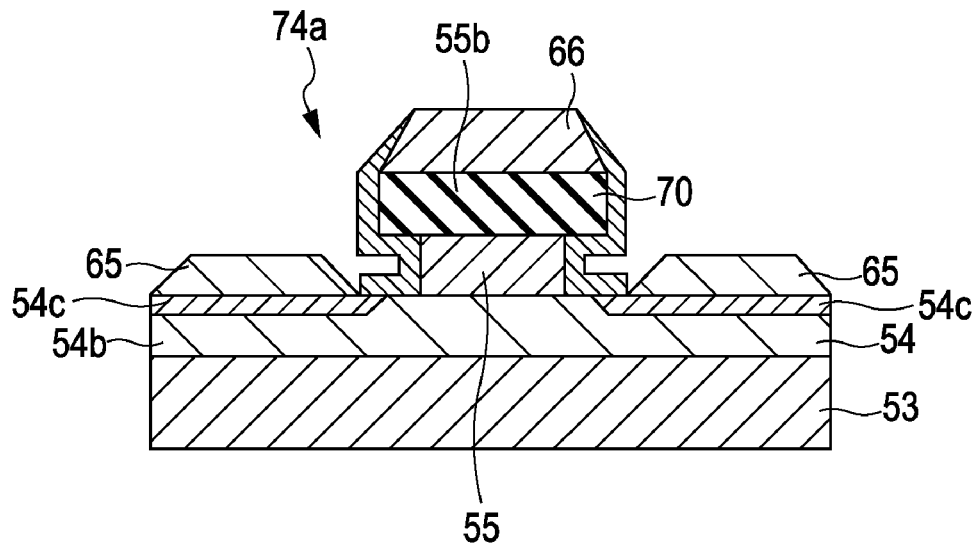
FIG. 19 is a cross-sectional view of a known HBT.
Figure 20:
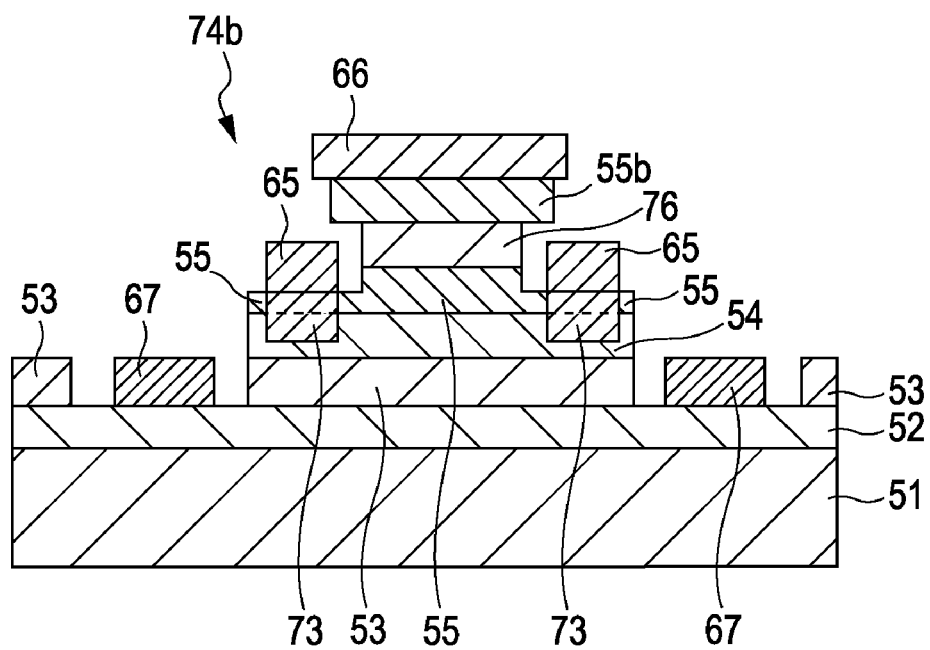
FIG. 20 is a cross-sectional view of another known HBT.
Figure 21:
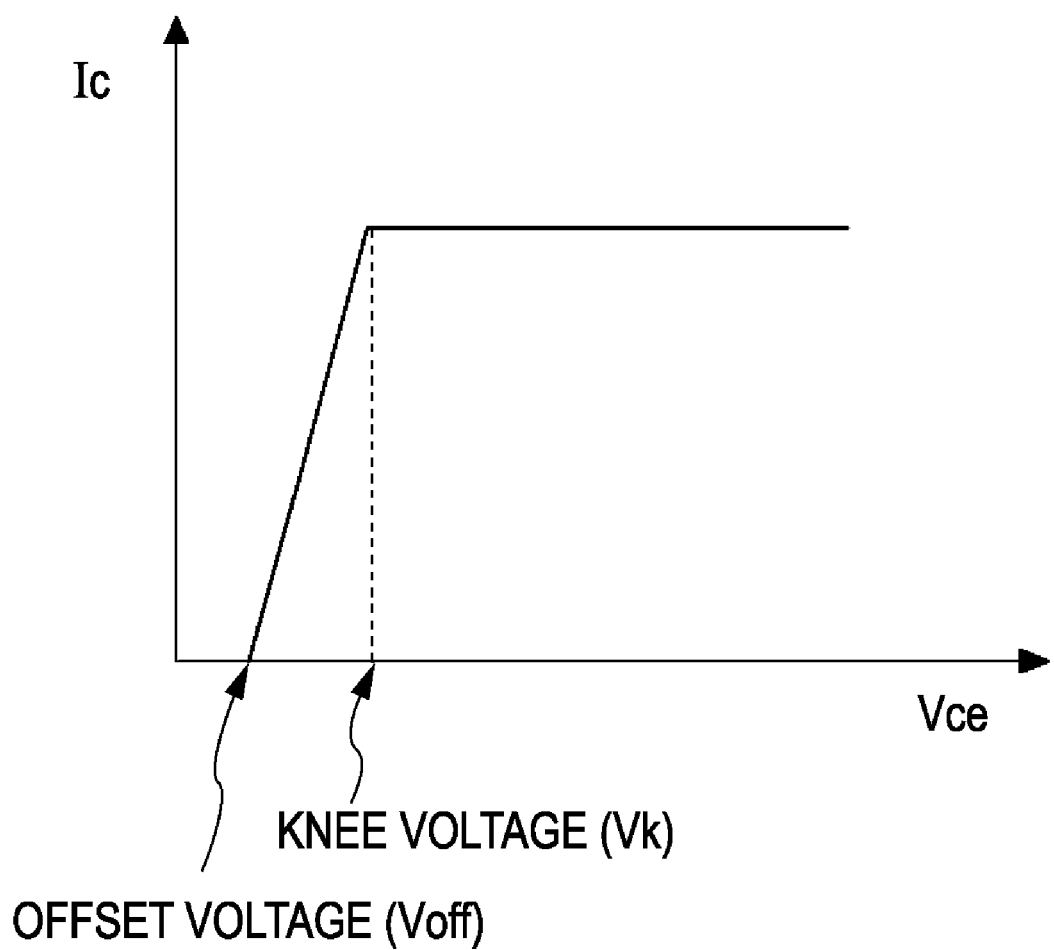
FIG. 21 shows current-voltage characteristics of a HBT.

FIGS. 18A and 18B are each an energy band diagram of the HBT shown in FIG. 17 in the direction perpendicular to the substrate and each show the energy levels of the conduction band Ec and the valence band Ev.

The first emitter sublayer 41 and the first collector sublayer 35 each function as a hole-blocking sublayer in which the sum of the electron affinity (difference in energy between the standard zero level and a conduction band level Ec) and the band gap (difference between the conduction band level Ec and a valence band level Ev) is greater than that of the base layer 38.

In addition, the effects described in the first embodiment are also obtained.

Various modification of the embodiments described above may be made on the basis of the technical idea of the present invention.

For example, the impurity concentration and the thickness of each of the above-described heavily doped thin sublayer and other sublayers and layers may be changed.

Furthermore, the shape of the mesa structure of the laminate containing the collector layer, the base layer, and the emitter layer and the configuration of the electrodes for connection with the layers and the sublayers are not limited to the above-described embodiments. Various shapes and configurations may be used.

Moreover, in the above-described embodiments, npn-type bipolar transistors are described. However, the present invention may be applied to pnp-type bipolar transistors.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   base layer;
   an emitter layer having a first graded sublayer, a first heavily doped thin sublayer, and a first emitter sublayer laminated in order from a first surface of the base layer, the impurity concentration of the first heavily doped thin sublayer being greater than those of the first graded sublayer and the first emitter sublayer; and
   a collector layer having a second graded sublayer, a second heavily doped thin sublayer, and a first collector sublayer laminated in order from a second surface of the base layer, the impurity concentration of the second heavily doped thin sublayer being greater than those of the second graded sublayer and the first collector sublayer,
   the first and second graded sublayers each having graded electron affinity due to composition modulation.

2. The semiconductor device according to claim 1, wherein the first heavily doped thin sublayer included in the emitter layer has a sheet carrier concentration of $3\times10^{11}$ cm$^{-2}$ or more; and
   the second heavily doped thin sublayer included in the collector layer has a sheet carrier concentration of $1.5\times10^{11}$ cm$^{-2}$ or more.

3. The semiconductor device according to claim 2, wherein the first heavily doped thin sublayer included in the emitter layer has a sheet carrier concentration higher than that of the second heavily doped thin sublayer included in the collector layer.

4. The semiconductor device according to claim 1, wherein the first graded sublayer disposed between the first heavily doped thin sublayer included in the emitter layer and the base layer has a thickness of 15 nm or less.

5. The semiconductor device according to claim 1, wherein each of the emitter layer and the collector layer further include:
   a hole-blocking sublayer in which the sum of the electron affinity and the band gap of the hole-blocking sublayer is greater than that of the base layer.

6. The semiconductor device according to claim 5, wherein each of the first and second heavily doped thin sublayers included in the respective emitter layer and the collector layer has the same composition as the hole-blocking sublayer.

7. The semiconductor device according to claim 1, further comprising:
   a GaAs semiconductor substrate;
   wherein the semiconductor device includes a heterojunction bipolar transistor.

8. The semiconductor device according to claim 1, wherein an interface between the emitter layer and the base layer and an interface between the collector layer and the base layer each has a hetero-junction structure.

* * * * *